United States Patent
Tagawa et al.

(10) Patent No.: US 8,618,863 B2
(45) Date of Patent: Dec. 31, 2013

(54) SIGNAL DISTRIBUTION CIRCUIT, SIGNAL DISTRIBUTION DEVICE, AND DISPLAY DEVICE

(75) Inventors: Akira Tagawa, Osaka (JP); Mayuko Sakamoto, Osaka (JP); Yoshihisa Takahashi, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 13/583,313

(22) PCT Filed: Nov. 11, 2010

(86) PCT No.: PCT/JP2010/070147
§ 371 (c)(1),
(2), (4) Date: Sep. 7, 2012

(87) PCT Pub. No.: WO2011/118079
PCT Pub. Date: Sep. 29, 2011

(65) Prior Publication Data
US 2013/0038518 A1    Feb. 14, 2013

(30) Foreign Application Priority Data
Mar. 24, 2010  (JP) ................................ 2010-068728

(51) Int. Cl.
*H03K 17/00* (2006.01)
*H01L 27/01* (2006.01)
(52) U.S. Cl.
USPC ............... 327/416; 345/92; 345/204; 349/42; 349/46; 257/59; 257/72
(58) Field of Classification Search
USPC ......... 327/291, 293, 295, 403, 404, 415, 416, 327/427, 434; 345/87, 90, 92, 204; 349/41–43, 46; 257/59, 72
See application file for complete search history.

(56) References Cited

U.S. PATENT DOCUMENTS

| | | | |
|---|---|---|---|
| 6,906,385 B2 * | 6/2005 | Moon et al. | 257/347 |
| 7,436,384 B2 * | 10/2008 | An | 345/98 |
| 2011/0273223 A1 | 11/2011 | Sakamoto et al. | |
| 2012/0299887 A1 * | 11/2012 | Tanaka et al. | 345/204 |

FOREIGN PATENT DOCUMENTS

| | | |
|---|---|---|
| JP | 64-084297 A | 3/1989 |
| JP | 2000-029441 A | 1/2000 |
| JP | 2003-149673 A | 5/2003 |
| JP | 2005-055616 A | 3/2005 |
| JP | 2005-107382 A | 4/2005 |
| JP | 2008-097005 A | 4/2008 |
| WO | 2010/095306 A1 | 8/2010 |

OTHER PUBLICATIONS

Official Communication issued in International Patent Application No. PCT/JP2010/070147, mailed on Dec. 14, 2010.

\* cited by examiner

*Primary Examiner* — Patrick O'Neill
(74) *Attorney, Agent, or Firm* — Keating & Bennett, LLP

(57) ABSTRACT

Disclosed is a signal distribution device which is provided with: supply lines (5) for supplying input signals to switching elements in signal distribution circuits; and distribution lines (6) for distributing the input signals to output terminals via the switching elements. The corresponding one of the supply lines (5) and at least one of the distribution lines (6) each have an extension section (5a) and an extension section (5b) which extend in an extending direction of a control line (13). A selection signal for switching on/off the associated switching element is applied to the control line (13). The extension sections (5a and 5b) are formed at positions that do not overlap the edge portions of the control line (13) in the extending direction thereof.

10 Claims, 21 Drawing Sheets

SIGNAL DISTRIBUTION CIRCUIT, SIGNAL DISTRIBUTION DEVICE, AND DISPLAY DEVICE

TECHNICAL FIELD

The present invention relates to a signal distribution circuit which distributes an input signal to output terminals by time division, a signal distribution device including the signal distribution circuit, and a display device including the signal distribution device.

BACKGROUND ART

Various types of liquid crystal displays (LCD's) have been developed as flat display devices. Among them, those based on active matrix technology are popular. A plurality of source drivers are used in many of the devices because the number of signal lines has increased in order to cope with recent increase in pixel number in pixel matrix sections for high definition.

Use of a plurality of source drivers entails various problems including the following ones: (1) The bonding steps to attach the source drivers increase in number, and productivity falls. (2) Poor yields and defects, such as corrosion caused by a difference in electric potential between terminals, are likely to occur in the source driver bonding steps due to the narrowing of signal line pitches. (3) Boundaries for each source driver develop on the display screen of the display device due to, for example, a difference in characteristics between the source drivers or a difference in contact resistance between terminals.

Patent Literature 1 (see the list below), in order to solve these inconveniences, discloses a display device which eliminates the need to use a plurality of source drivers by providing the display device with a source driver capable of electric signal outputs using one third the terminals of conventional source drivers.

FIG. 21 is a diagram illustrating the entire arrangement of a display device 51 as the display device of Patent Literature 1. As illustrated in FIG. 21, the display device 51 is provided with: a pixel matrix section 55 which includes a matrix of pixels arranged in m rows and n columns; a gate driver 53; and a source driver 52 which outputs a drive signal to each red, green, and blue pixel in the pixel matrix section 55 as time-divided driver output signals. The display device 51 is further provided with a signal distribution device 54 formed monolithically on a TFT substrate. The display device 51 is adapted so that the signal distribution device 54 can distribute the driver output signal outputs from the source driver 52 to the signal lines for the pixel matrix section 55.

FIG. 22 is a diagram illustrating the internal arrangement of the signal distribution device 54. As illustrated in FIG. 22, the signal distribution device 54 includes a matrix of distribution lines 57(1, r), 57(1, g), and 57(1, b) to 57(n, r), 57(n, g), and 57(n, b) which correspond respectively to driver output signals Si_1 to Si_n (n is 2 or a greater integer) which are supplied from the source driver 52 and control lines 59_r, 59_g, and 59_b to which switching signals are applied to switch the distribution lines to which the driver output signals Si_1 to Si_n are fed (r, g, and b denote red, green, and blue respectively).

The distribution lines 57(1, r), 57(1, g), and 57(1, b) to 57(n, r), 57(n, g), and 57(n, b) have their output terminals connected to the signal lines for the pixel matrix section 55. The distribution lines are also connected to respective TFT 60(1, r), 60(1, g), 60(1, b) to 60(n, r), 60(n, g), 60(n, b) as switching elements. The control lines 59_r, 59_g, and 59_b are connected respectively to the gates of the TFT 60(1, r) to 60(n, r), 60(1, g) to 60(n, g), and 60(1, b) to 60(n, b).

FIG. 23 is a timing chart for signals for time-division driving of three distribution lines, for example, the distribution lines 57(1, r), 57(1, g), and 57(1, b), in the display device 51. As illustrated in FIG. 23, first, the source driver 52 outputs a driver output signal Si_k to pixels in the k-th one of the n columns (k is an integer such that $1 \leq k \leq n$). At the same time, the driver output signal Si_k is switched by time division according to the switching signals applied to the control lines 59_r, 59_g, and 59_b, so as to be fed to the signal lines for the red, green, and blue pixels in the j-th one of the m rows in the pixel matrix section 55 (j is an integer such that $1 \leq j \leq m$).

The red, green, and blue pixels in the j-th row are selected according to a scan signal Vg(j). The scan signals Vg(1) to Vg(m) are applied by the gate driver 53 to the scan lines of the pixel matrix section 55.

The source driver 52, arranged as above, can output electric signals using one third the terminals of conventional source drivers, thereby eliminating the need to provide a plurality of source drivers.

Patent Literature 2 (see the list below) discloses the distribution circuit geometry shown in FIG. 24. The distribution circuit in FIG. 24 has comb-like source and drain electrodes for switching elements 60. The geometry is suited for faster switching speed because it effectively enables wider channel widths.

CITATION LIST

Patent Literature

Patent Literature 1
Japanese Patent Application Publication, Tokukai, No. 2004-294858A (Published Oct. 21, 2004)
Patent Literature 2
Japanese Patent Application Publication, Tokukaisho, No. 64-084297A (Published Mar. 29, 1989)
Patent Literature 3
Japanese Patent Application Publication, Tokukai, No. 2000-029441A (Published Jan. 28, 2000)
Patent Literature 4
Japanese Patent Application Publication, Tokukai, No. 2005-055616A (Published Mar. 3, 2005)
Patent Literature 5
Japanese Patent Application Publication, Tokukai, No. 2005-107382A (Published Apr. 21, 2005)
Patent Literature 6
Japanese Patent Application Publication, Tokukai, No. 2008-097005A (Published Apr. 24, 2008)

SUMMARY OF INVENTION

Technical Problem

The technology disclosed in Patent Literatures 1 and 2 does not at all address a problem that the display on the liquid crystal display can be adversely affected depending on how the control lines overlap the distribution lines in the A signal distribution device, In other words, the use of a distribution circuit can advantageously reduce the number of output terminals of the source driver, but inevitably entails the following problems.

In actuality, the distribution circuit has parasitic capacitances 61 as indicated in FIG. 25. The parasitic capacitances 61 develop where the source electrodes of the switching elements 60(k, r), 60(k, g), and 60(k, b) overlap the control lines 59_r, 59_g, and 59_b, where the drain electrodes of the switching elements 60(k, r), 60(k, g), and 60(k, b) overlap the control lines 59_r, 59_g, and 59_b, and where the distribution lines 57 (k, r) and 57 (k, g) overlap the control line 59_g and 59_b.

If line resistances of the parasitic capacitances 61, the distribution lines 57 (k, r), etc. vary, the display quality of the liquid crystal display may vary. In a severe case, adjacent distribution lines may be short-circuited.

For example, in the distribution circuit shown in FIG. 24, parts of a supply line 58 overlap edge portions of control lines 59 in an extending direction of the control lines 59. The following will describe the problems specifically with a focus on a region R in FIG. 24, in reference to the perspective view of FIG. 11 which illustrates a line arrangement that is similar to the one in the region R.

As illustrated in FIG. 11, control wires 71, equivalents to the control lines 59, are provided by forming a gate metal layer on a glass substrate 70 and patterning the gate metal layer. Next, a gate insulating film 72 is formed on the control wires 71. Wires 73 are then formed by patterning (etching) a metal layer laminated on the gate insulating film 72.

In this process, steps are formed along edge portions of the control wires 71. Therefore, when the wires 73 are formed by patterning, the steps can be a likely cause for etching residues 75 to be left in regions 74 between the wires. Residues of the metal layer will especially likely remain near the steps if longer wires 73 are to be formed on the steps along the steps (i.e., in the y direction shown in FIG. 11) because the extra length causes the etching to progress at different speeds on the steps and non-step regions and thereby makes it difficult to etch the metal layer.

The etching residues 75 could short-circuit adjacent wires 73, and even if not, might change parasitic capacitances or line resistances of the wires 73.

In an arrangement in which a wire 73 partly overlaps edge portions of a control wire 71 in an extending direction of the control wire 71, the steps make it difficult to form the wire 73 with a constant thickness. This could be another cause for uneven parasitic capacitances and line resistances of the wire 73.

Therefore, the line arrangement of conventional signal distribution circuits may cause irregular display quality in a display device.

The present invention, conceived to address the problems, has a primary object to provide a signal distribution circuit, as well as a signal distribution device, having a line arrangement which ensures increased display quality in a display device.

Solution to Problem

A signal distribution device in accordance with the present invention, to solve the problems, includes a plurality of signal distribution circuits each of which includes:

(1-1) a single input terminal for receiving an input signal;
(1-2) a plurality of switching elements connected to the input terminal, each of the plurality of switching elements being composed of a thin film transistor;
(1-3) supply lines for supplying, to the plurality of switching elements, the input signal fed to the input terminal; and
(1-4) a plurality of distribution lines connected respectively to a plurality of output terminals via the plurality of switching elements,
(1-5) the plurality of signal distribution circuits each distributing the input signal to the plurality of output terminals via the plurality of switching elements respectively, wherein (2) each of the plurality of switching elements includes:
a gate electrode;
a first electrode connected to the input terminal via a corresponding one of the supply lines; and
a second electrode connected to a corresponding one of the plurality of output terminals via a corresponding one of the plurality of distribution lines,
(3) the plurality of signal distribution circuits are each provided with a plurality of control lines respectively connected to, or functioning as, the gate electrodes of the plurality of switching elements, each of the plurality of control lines being for receiving a selection signal for switching on/off a corresponding one of the plurality of switching elements,
(4) the corresponding one of the supply lines and at least one of the plurality of distribution lines each have an extension section which extends in an extending direction of a corresponding one of the plurality of control lines, and
(5) the extension sections are each formed at positions which do not overlap edge portions of the corresponding one of the plurality of control lines in the extending direction thereof.

A signal distribution circuit in accordance with the present invention includes:

(1-1)' a single input terminal for receiving an input signal;
(1-2)' a plurality of switching elements connected to the input terminal, each of the plurality of switching elements being composed of a thin film transistor;
(1-3)' supply lines for supplying, to the plurality of switching elements, the input signal fed to the input terminal; and
(1-4)' a plurality of distribution lines connected respectively to a plurality of output terminals via the plurality of switching elements,
(1-5)' the signal distribution circuit distributing the input signal to the plurality of output terminals via the plurality of switching elements respectively,
wherein (2)' each of the plurality of switching elements includes:
a gate electrode;
a first electrode connected to the input terminal via a corresponding one of the supply lines; and
a second electrode connected to a corresponding one of the plurality of output terminals via a corresponding one of the plurality of distribution lines,
(3)' the signal distribution circuit is provided with a plurality of control lines respectively connected to, or functioning as, the gate electrodes of the plurality of switching elements, each of the plurality of control lines being for receiving a selection signal for switching on/off a corresponding one of the plurality of switching elements,
(4)' the corresponding one of the supply lines and at least one of the plurality of distribution lines each have an extension section which extends in an extending direction of a corresponding one of the plurality of control lines, and
(5)' the extension sections are each formed at positions which do not overlap edge portions of the corresponding one of the plurality of control lines in the extending direction thereof.

According to either one of the signal distribution device and the signal distribution circuit, the input signal fed to the single input terminal is supplied to the first electrode of each switching element via a corresponding one of the supply lines for the switching element. The switching element is selectively turned on through a selection signal which is applied to its gate electrode via a corresponding one of the control lines. As the switching element is turned on, the input signal is transmitted from the first electrode to the second electrode and further transmitted to one of the output terminals via one of the distribution lines which is associated with the switching element. If two or more of the switching elements are sequentially selected through the selection signal according to a time sequence, the input signal fed to the single input terminal is distributed to the output terminals associated with those switching elements according to the time sequence.

The corresponding one of the supply lines and at least one of the distribution lines each have an extension section which extends in an extending direction of the associated control line. The extension sections are an inevitable consequence from a line layout problem in the signal distribution circuit. It should be noted that extending in an extending direction of a control line is by no means limited to extending parallel to the extending direction of the control line.

Each extension section is formed at positions which do not overlap edge portions of the associated control line in the extending direction of that control line. The position may be determined in an area having a width parallel to a direction that is perpendicular to the extending direction of the control line. Alternatively, the position may be determined within a space adjacent to the control line, that is, a space in which there is no control line.

Therefore, no extension section is provided on the steps formed along the edge portions of the control line. This prevents generation of etching residues mentioned above and also makes it easier to form the supply lines and the distribution lines with a constant thickness. As a result, unevenness of the parasitic capacitances and line resistances related to the supply lines and the distribution lines can be restrained. An effect that the display quality of a display device can be improved can be thus achieved.

A display device in accordance with the present invention is provided with the signal distribution device.

The arrangement results in the advantage of being able to improve the display quality of the display device provided with the signal distribution device of the present invention.

Combinations of an arrangement described in a claim in consideration and an arrangement described in another claim are not limited only to combinations with an arrangement described in a claim from which the claim in consideration is dependent, and may be combinations with an arrangement described in a claim from which the claim in consideration is not dependent, provided that the object of the present invention can be achieved.

ADVANTAGEOUS EFFECTS OF INVENTION

A signal distribution device in accordance with the present invention, as described in the foregoing, includes: supply lines for supplying an input signal to switching elements in a signal distribution circuit; and distribution lines for distributing the input signal to output terminals via the switching elements. The corresponding one of the supply lines and at least one of the distribution lines each have an extension section which extends in an extending direction of one of control lines to which a selection signal for switching on/off the switching elements is applied. Each extension section is formed at positions which do not overlap edge portions of the associated control line in the extending direction of that control line.

Therefore, no extension section is provided on the steps formed along the edge portions of the control line. This prevents generation of etching residues and also makes it easier to form the supply lines and the distribution lines with a constant thickness. As a result, short-circuits between wires can be prevented. Unevenness of the parasitic capacitances and line resistances related to the supply lines and the distribution lines can be restrained. An effect that the display quality of a display device can be improved can be thus achieved.

BRIEF DESCRIPTION OF DRAWINGS

FIG. 1 is a plan view illustrating in detail an arrangement of supply lines and distribution lines in a signal distribution device in accordance with an embodiment of the present invention and also illustrating relative positions of (i) the supply lines and the distribution lines and (ii) slits and grating sections of control lines.

FIG. 2 is a plan view of major components, showing another example of relative positions of (i) the supply line and the distribution line and (ii) the slits and the grating sections of the control line.

FIG. 3 is a plan view illustrating an electrode arrangement and a line arrangement of TFT's constituting a signal distribution circuit.

FIG. 4 is a block diagram illustrating a basic arrangement of a display device in accordance with the present invention.

FIG. 5 is a circuit diagram representing a circuit arrangement of the signal distribution circuit.

FIG. 6 is an illustration of TFT's in which drain electrodes, source electrodes, and slits and grating sections of control lines are fabricated at higher density.

FIG. 7 is an illustration of TFT's, a gap section, and the condition of wiring in the gap section as a comparative example.

FIG. 8 is an enlarged illustration of the condition of wiring in the gap section as a comparative example.

FIG. 9 is a combination drawing of a partial plan view illustrating the condition of wiring of the present embodiment in a gap section of a control line and an enlarged perspective view illustrating wiring in the area indicated in the partial plan view.

FIG. 10 is a combination drawing of a partial plan view illustrating the condition of other wiring and an enlarged perspective view illustrating wiring in the area indicated in the partial plan view, as an alternative example of the wiring layout shown in FIG. 9.

FIG. 11 is a combination drawing of a partial plan view illustrating the condition of wiring in the gap section and an enlarged perspective view illustrating wiring in the area indicated in the partial plan view, as a comparative example.

FIG. 12 is a plan view illustrating an alternative example of slits of control lines in a signal distribution device in accordance with an embodiment of the present invention and also illustrating the condition of wiring of supply lines and distribution lines in relation to the slit.

FIG. 13 is an illustration of an example of a wiring structure, viewed from above, for a signal distribution circuit in accordance with Embodiment 2 of the present invention.

FIG. 14 is an illustration of an alternative example of a control line, viewed from above.

FIG. 15 is an illustration of another example of a wiring structure, viewed from above, for a signal distribution circuit in accordance with Embodiment 2 of the present invention.

FIG. 16 is an illustration of a further example of a wiring structure, viewed from above, for a signal distribution circuit in accordance with Embodiment 2 of the present invention.

FIG. 17 is an illustration of still another example of a wiring structure, viewed from above, for a signal distribution circuit in accordance with Embodiment 2 of the present invention.

FIG. 18 is an illustration of yet another example of a wiring structure, viewed from above, for a signal distribution circuit in accordance with Embodiment 2 of the present invention.

FIG. 19 is a circuit diagram representing another circuit arrangement of a signal distribution circuit.

FIG. 20 is a timing chart showing timings for selection signals through which the switching elements constituting the signal distribution circuit shown in FIG. 19 are selected and timings for scan signals with which picture elements are sequentially selected a line at a time.

FIG. 21 is a schematic illustration of an arrangement of a typical display device.

FIG. 22 is a circuit diagram representing an internal arrangement of a conventional signal distribution circuit.

FIG. 23 is a timing chart for a conventional signal distribution circuit.

FIG. 24 is a plan view of a wiring structure of a conventional signal distribution circuit.

FIG. 25 is a circuit diagram representing an internal arrangement of a typical signal distribution circuit.

DESCRIPTION OF EMBODIMENTS

[Embodiment 1]

Figure 1:
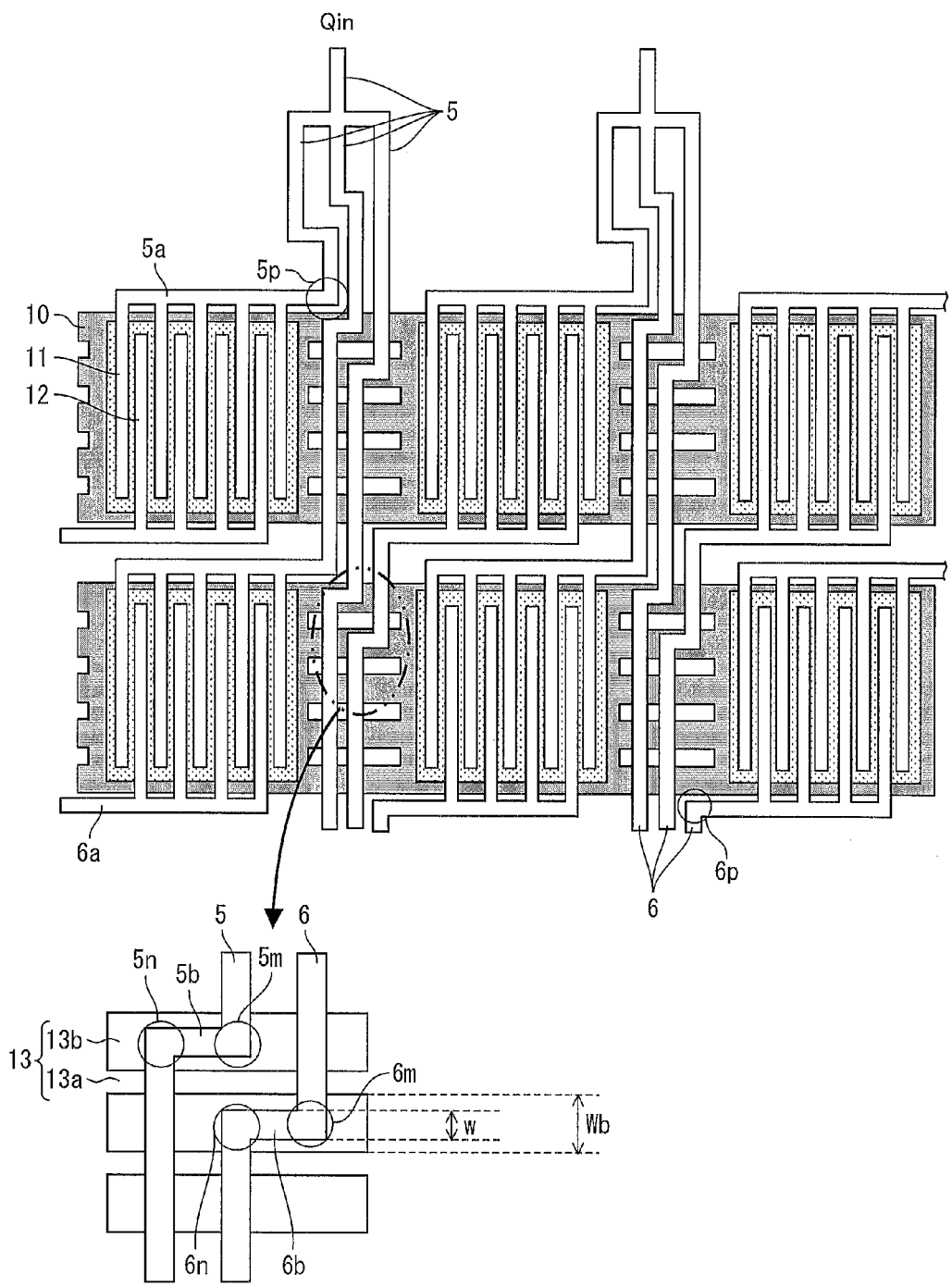
FIG. 1

The following will describe an embodiment of the present invention in reference to drawings. The dimensions, materials, shapes, relative positions, etc. of components described in Embodiment 1 are only illustrative and are not intended to limit the scope of the invention unless otherwise indicated.
(Basic Arrangement of Display Device and Signal Distribution Device)

A display device 1 of Embodiment 1 has a basic arrangement similar to that of the display device 51 described above in reference to FIG. 21. The display device 1 is provided with: a display panel 56 including a display area where a pixel matrix section 55 is provided and a peripheral area; and a signal distribution device 3 (detailed later) which is formed monolithically in the peripheral area. The signal distribution device 3 corresponds to the signal distribution device 54.

Figure 4:
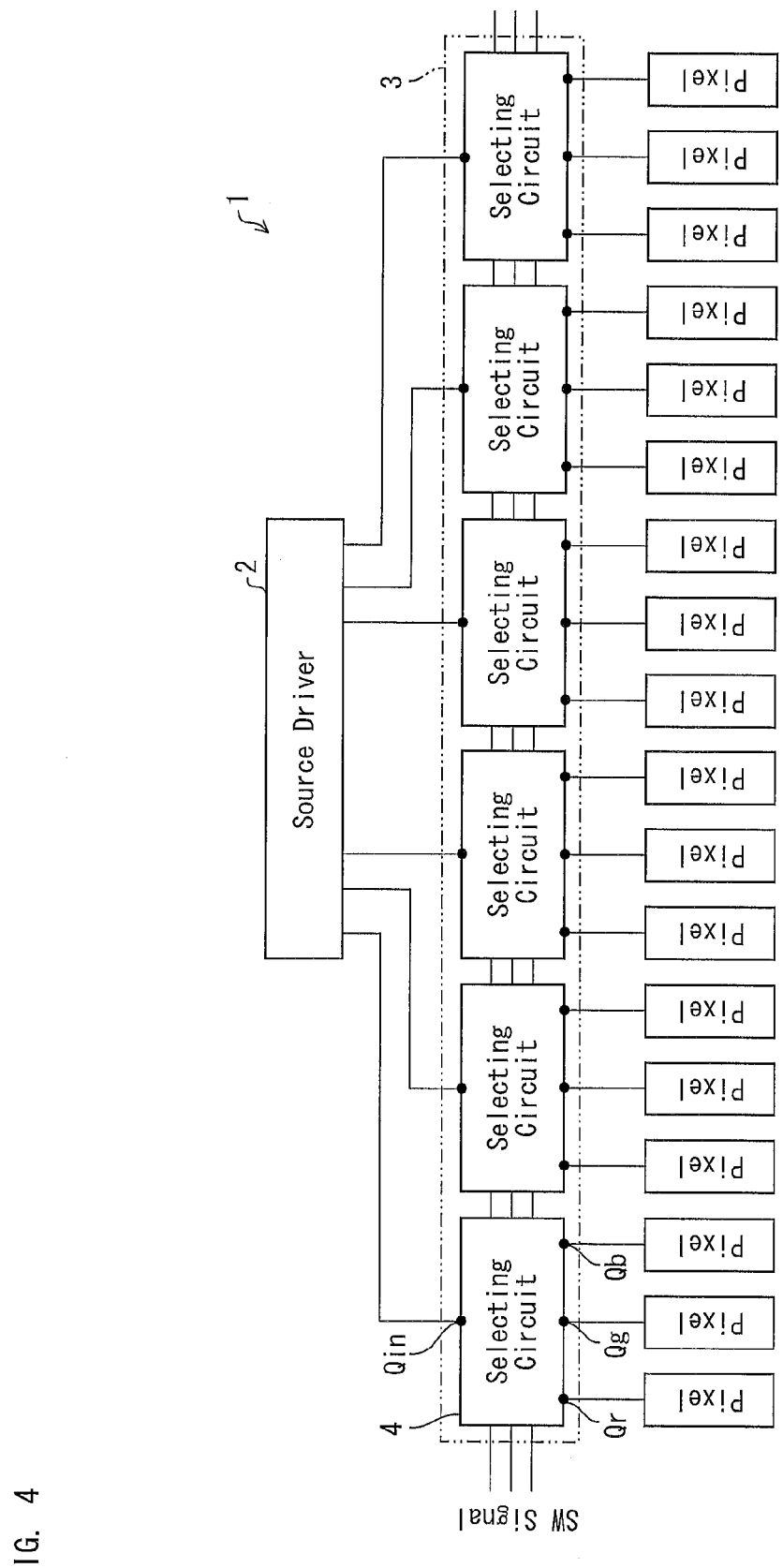
FIG. 4
Figure 21:
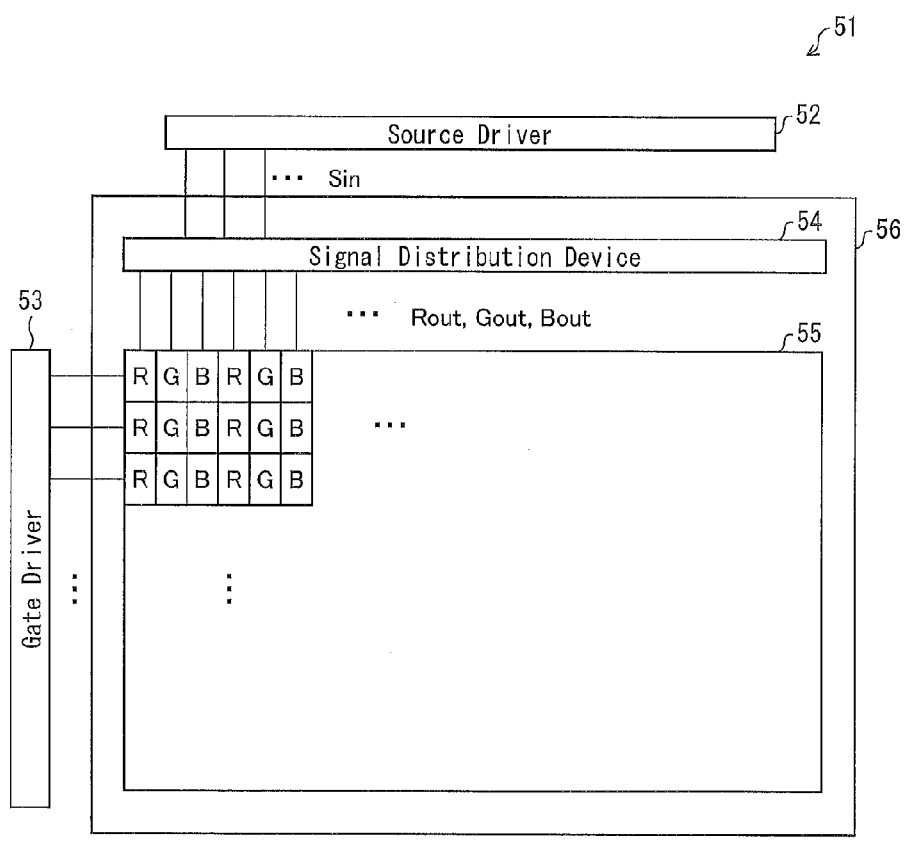
FIG. 21

FIG. 4 is a block diagram of a display device 1, more schematically showing the arrangement in FIG. 21. As illustrated in FIG. 4, the display device 1, which may be, for example, a liquid crystal display device, includes the signal distribution device 3 which is connected to a source driver 2. The signal distribution device 3 is also referred to as an SSD (source shared driving) section. The signal distribution device 3 is provided with a plurality of selecting circuits 4 as a plurality of signal distribution circuits.

Figure 5:
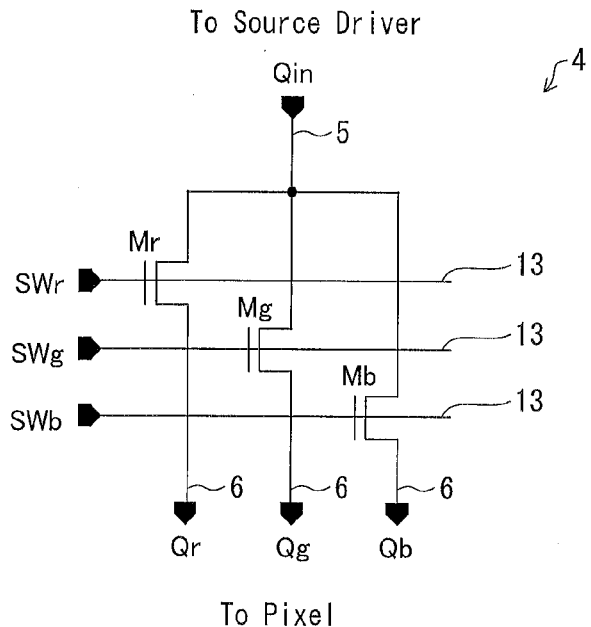
FIG. 5

FIG. 5 is a circuit diagram representing a circuit arrangement of a selecting circuit 4. As illustrated in FIGS. 4 and 5, each selecting circuit 4 is provided with: a single input terminal Qin for receiving an input signal from the source driver 2; TFT-Mr's, TFT-Mg's, and TFT-Mb's (hereinafter, may be collectively referred to simply as TFT-M's), as a plurality of switching elements, connected to the input terminal Qin, each TFT-M being composed of a thin film transistor; a supply line 5 for supplying, to each TFT-M, the input signal fed to the input terminal Qin; and a plurality of distribution lines 6 connected respectively to, for example, three output terminals Qr, Qg, and Qb (hereinafter, may be collectively referred to simply as output terminals Qout) via the TFT-M's.

The output terminals Qr, Qg, and Qb are connected respectively to switching elements which respectively drive a red pixel, a green pixel, and a blue pixel constituting a picture element.

In Embodiment 1, the selecting circuit 4 temporally divides the input signal from the source driver 2 into three signals for supply to the distribution lines 6. The present invention is however by no means limited to dividing the input signal into three signals. The input signal may be divided into n signals (n is a natural number equal to or greater than two). In the case of the input signal being divided into n signals, the number of output terminals of the source driver 2 can be reduced to 1/n in comparison to a case where no signal distribution device 3 is used. Note that in the case of the input signal being divided into n signals, the signal distribution device 3 has n control lines 13, and each selecting circuit 4 has n TFT-M's.
(Alternative Example of Signal Distribution Circuit)

Figure 19:
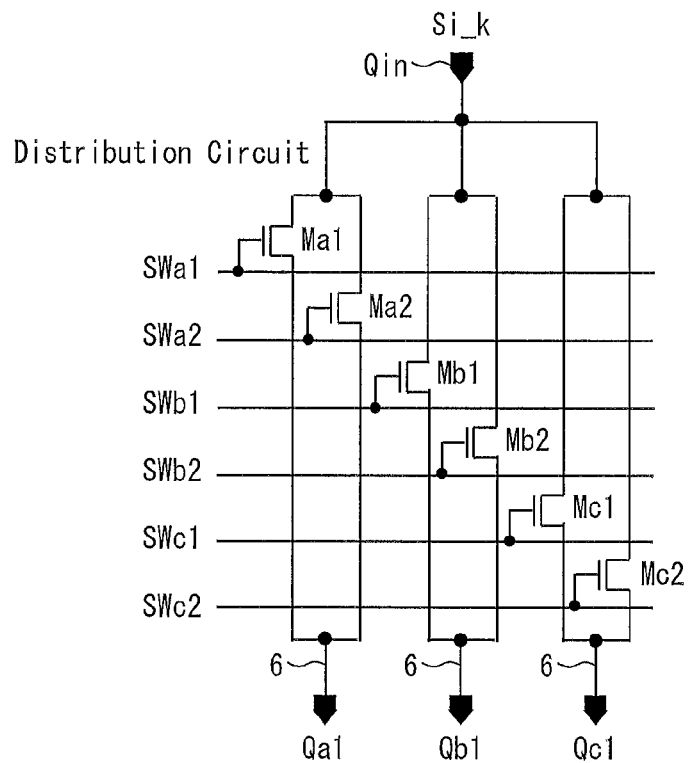
FIG. 19

The selecting circuit 4, as a signal distribution circuit, is by no means limited to the arrangement shown in FIG. 5. Alternatively, the selecting circuit 4 may be arranged as shown in FIG. 19. FIG. 19 is a circuit diagram representing another circuit arrangement of the selecting circuit 4. As illustrated in FIG. 19, the selecting circuit 4 is provided with a matrix of (i) distribution lines 6 which are associated respectively with a red pixel, a green pixel, and a blue pixel constituting a picture element and (ii) a plurality of control lines to which selection signals SWa1, SWa2, SWb1, SWb2, SWc1, and SWc2 are applied respectively. The selection signals SWa1, SWa2, SWb1, SWb2, SWc1, and SWc2 are used to switch between the distribution lines 6 to which a driver output signal Si_k fed from the source driver 2 to the picture elements in the k-th column is supplied.

The output terminal of each distribution line 6 is connected to a signal line of the pixel matrix section. Three pairs of parallel-connected TFT's (Ma1, Ma2, Mb1, Mb2, Mc1, Mc2), as switching elements, are connected between the input terminal Qin of the selecting circuit 4 and the distribution lines 6. The driver output signal Si_k is fed to the input terminal Qin. The control lines are connected respectively to the gate electrodes of the TFT's.

As described above, each of the two parallel-connected TFT's associated with a red pixel, a green pixel, and a blue pixel is provided with a control line individually. The two TFT's can be independently controlled to switch on/off through the individual control lines.

As described above, for example, TFT-Ma1 and TFT-Ma2 (a group of switching elements), which are among the plurality of switching elements, are connected in parallel between the single input terminal Qin and one of the plurality of output terminals Qa1, Qb1, and Qc1. Furthermore, the group of switching elements is provided with a group of control lines (e.g., a control line for a selection signal SWa1 and a control line for a selection signal SWa2) which are among the plurality of control lines, so that each one of the control lines corresponds to a different one of the switching elements.

Each group of control lines is associated with pixels in a different row.

Figure 20:
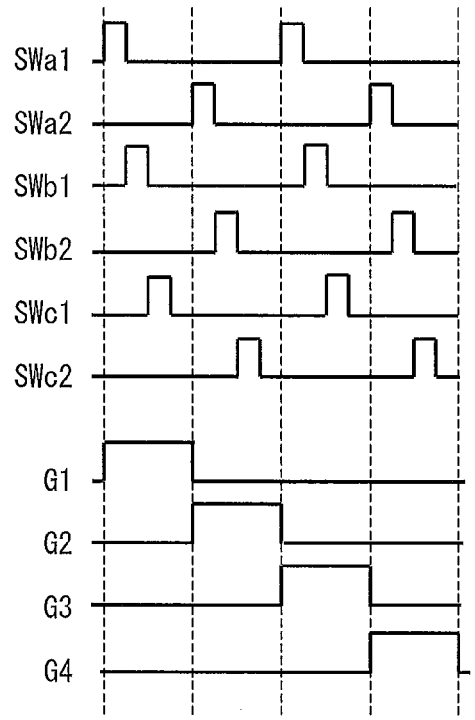
FIG. 20

FIG. 20 is a timing chart showing timings for the selection signals SWa1, SWa2, SWb1, SWb2, SWc1, and SWc2 and timings for scan signals G with which the picture elements are sequentially selected a line at a time.

As illustrated in FIG. 20, to select picture elements on row 1, the selection signals SWa1, SWb1, and SWc1 sequentially change to ON by time division so as to select one of the pair of TFT's associated with one of the distribution lines 6 in synchronization with the scan signal G1 changing to ON. Accordingly, the red pixel, the green pixel, and the blue pixel constituting a picture element located at the k-th column in row 1 is sequentially fed with a corresponding driver output signal.

Next, to select picture elements on row 2, the selection signals SWa2, SWb2, and SWc2 sequentially change to ON by time division so as to select the other one of the pair of TFT's associated with one of the distribution lines 6 in synchronization with the scan signal G2 changing to ON. Accordingly, the red pixel, the green pixel, and the blue pixel constituting a picture element located at the k-th column in row 2 is sequentially fed with a corresponding driver output signal.

By providing a plurality of TFT's for each distribution line and each one of the supply lines and alternately using the plurality of TFT's as described above, degradation of TFT's (shifting of threshold voltage) can be reduced. As a result, the selecting circuit 4 can operate in a more stable manner.

(Schematic Arrangement of Switching Element in Signal Distribution Circuit)

Figure 3:
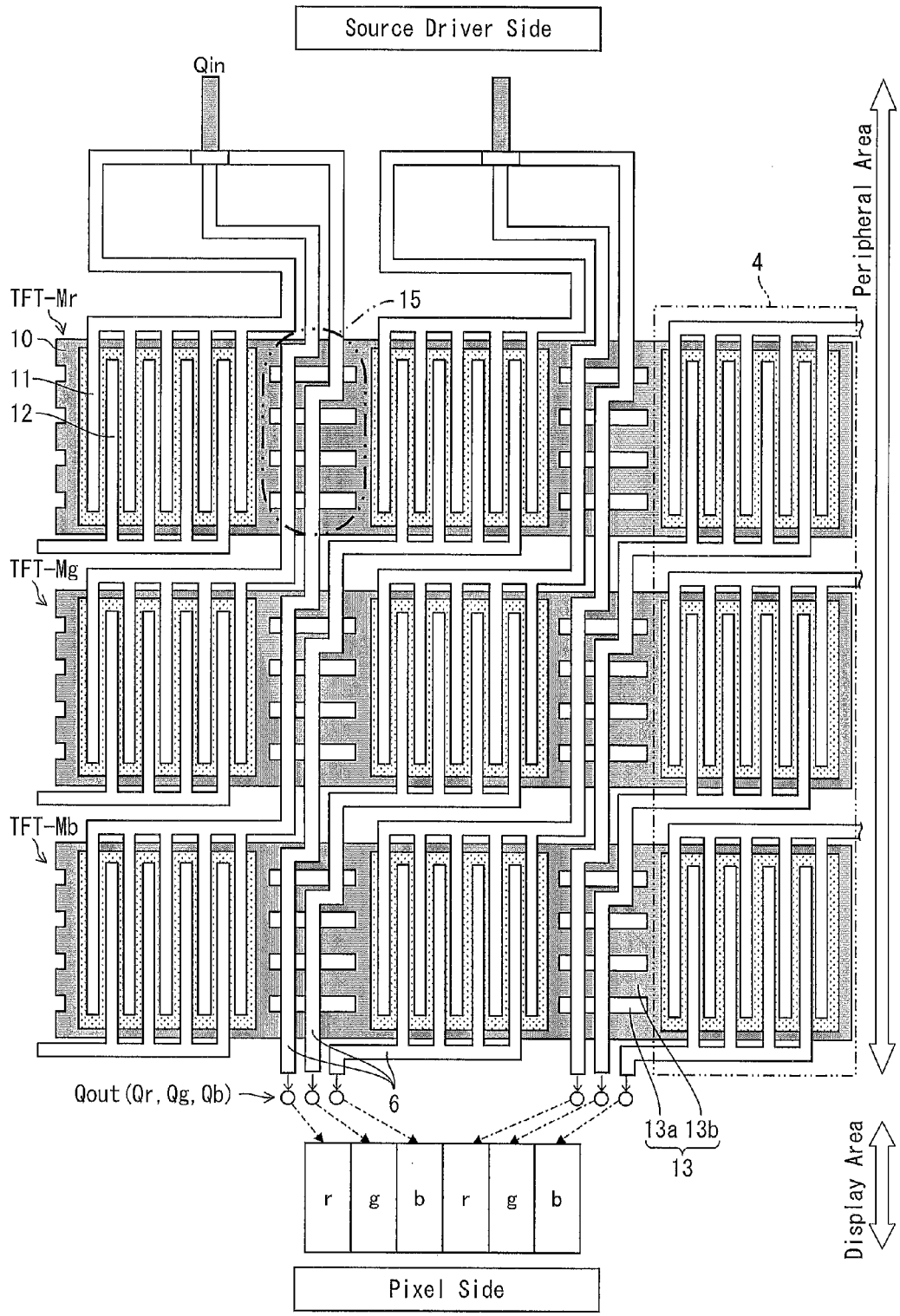
FIG. 3

FIG. 3 is a plan view illustrating an electrode arrangement and a line arrangement of the TFT-M's. The electrode and line arrangements of the TFT-M's are applicable as electrode and line arrangements of the TFT's in FIG. 19. Each TFT-M includes a gate electrode 10, a first electrode 11, and a second electrode 12. The first electrode (hereinafter, will be referred to as a drain electrode) 11 is connected to the input terminal Qin via the supply line 5 which is shown also in FIG. 1. The second electrode (hereinafter, will be referred to as a source electrode) 12 is connected to one of the output terminals Qout via a corresponding one of the distribution lines 6.

Each selecting circuit 4 is provided with a plurality of control lines 13 which are respectively connected (see FIGS. 3 and 5) to, or functioning (see FIGS. 19 and 22) as, the gate electrodes 10 of the TFT-M's. Each control line 13 is fed with a selection signal SWr, SWg, or SWb (hereinafter, may be collectively referred to simply as a selection signal SW) for switching on/off a corresponding TFT-M.

The selecting circuit 4 is formed monolithically in a peripheral area of the display panel of the display device on a substrate which constitutes the display panel, as illustrated in FIG. 3.

(Operation of Signal Distribution Circuit)

According to the above-mentioned arrangement, the input signal fed to the single input terminal Qin is supplied to the drain electrode 11 of each TFT-M via a corresponding one of the supply lines 5 for the TFT-M. The TFT-M is selectively turned on through the selection signal SW which is applied to its gate electrode 10 via a corresponding control line 13.

As the TFT-M is turned on, the input signal is transmitted from the drain electrode 11 to the source electrode 12 and further transmitted to one of the output terminals Qout via one of the distribution lines 6 which is associated with the TFT-M which has been turned on. Since two or more TFT-M's are sequentially selected through the selection signal SW according to a time sequence, the input signal fed to the single input terminal Qin is distributed to the output terminals Qout associated with those TFT-M's according to the time sequence.

Figure 23:
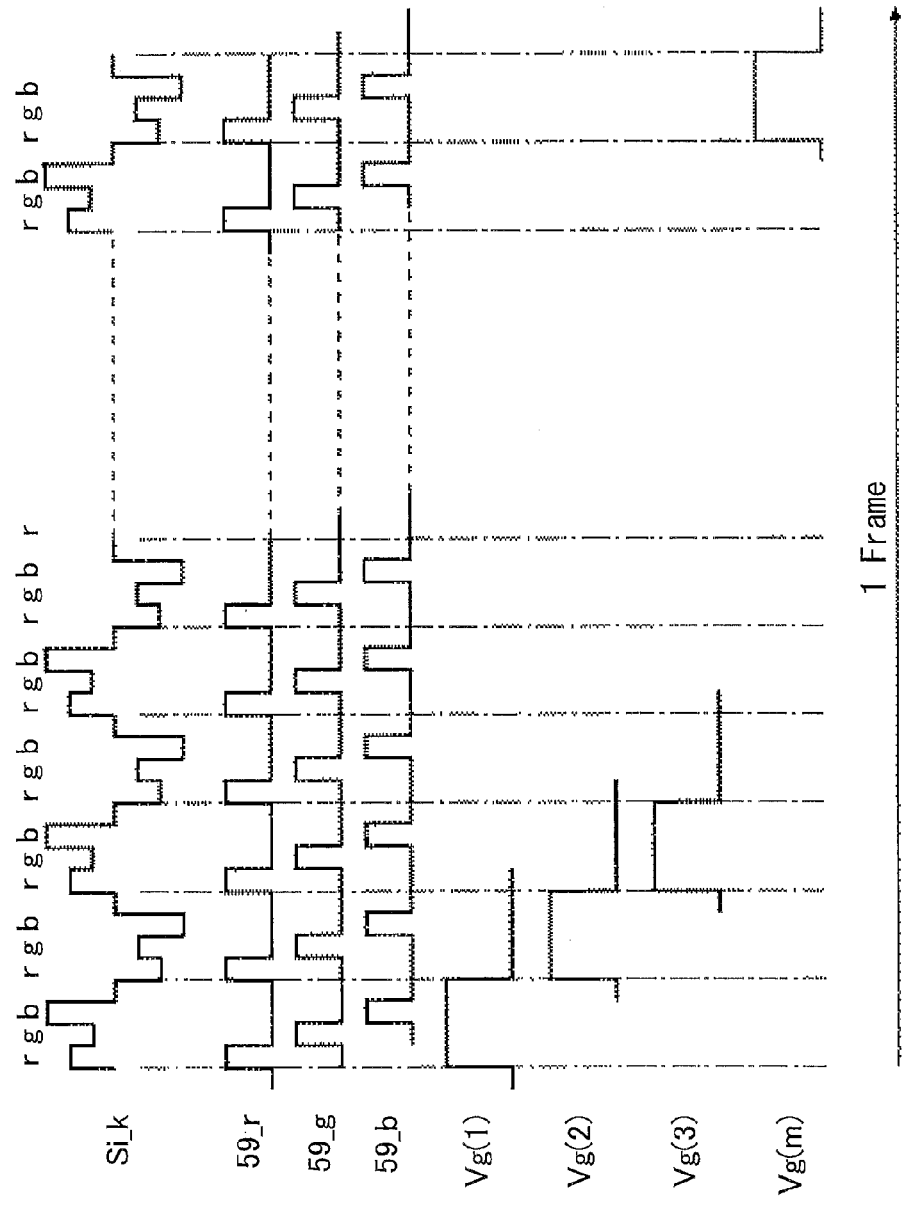
FIG. 23
Figure 24:
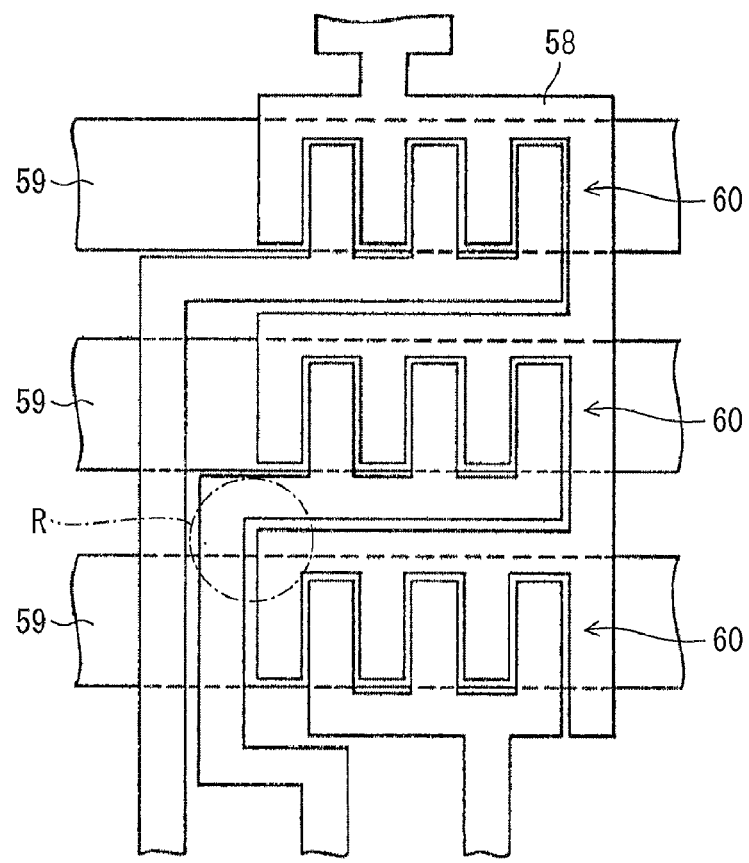
FIG. 24
Figure 25:
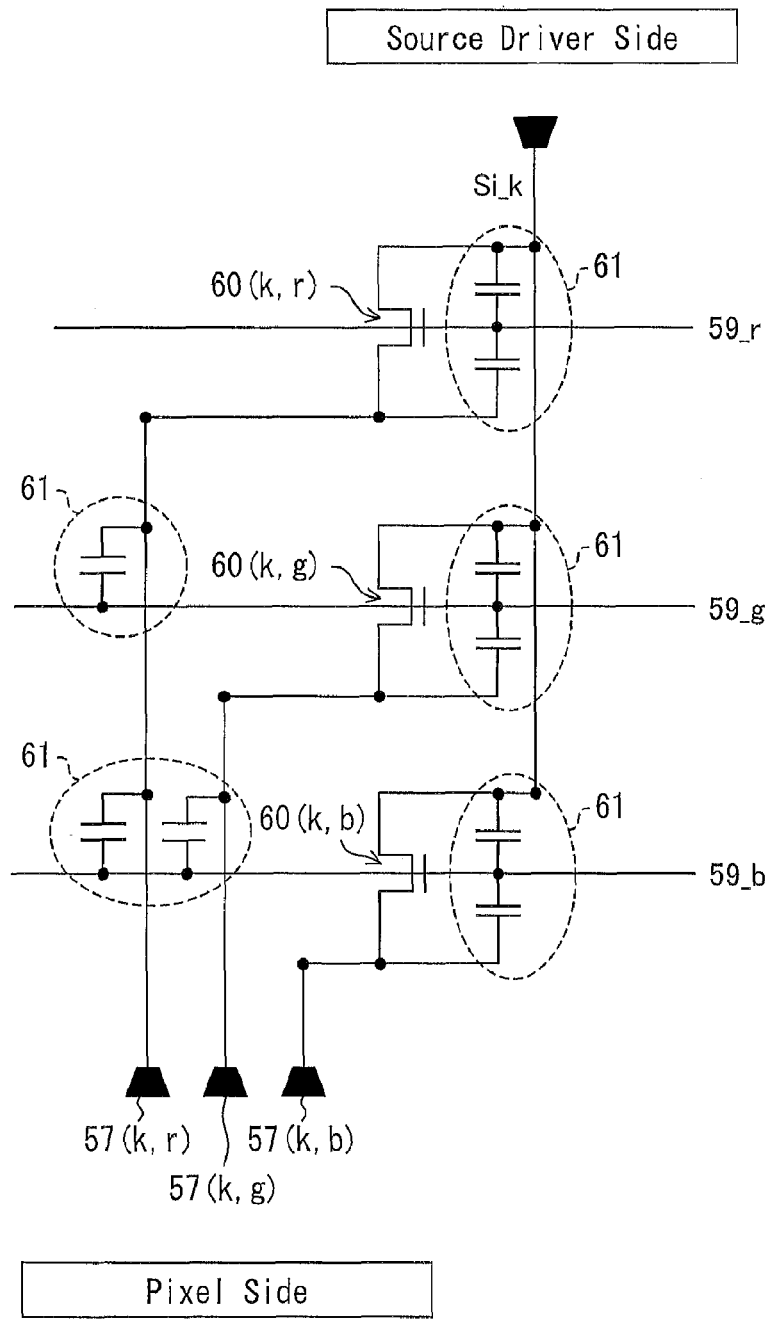
FIG. 25

More detailed timings of the signals through which the three TFT-M7s are driven by time division are basically the same as those described in reference to the timing chart of FIG. 23.

(Details of Arrangement of Control Line)

Referring to FIGS. 3 and 4, a selecting circuit 4 is provided for each set of a plurality of output terminals Qr, Qg, and Qb. A plurality of selecting circuits 4 are arranged in an extending direction of a control line 13 (e.g., a horizontal direction when the display screen is viewed from the front). In other words, the TFT-M's which belong to different selecting circuits 4 are provided on one of the control lines 13 in an extending direction of that control line 13.

Therefore, a gap section 15 is formed between a pair of adjacent ones of the TFT-M's arranged in the extending direction.

The one of the control lines 13 is provided, at least in the gap section 15, with a slit structure including: a slit 13a which extends in the extending direction; and a grating section 13b which extends in the extending direction and is grated by the slit 13a.

The control line 13 has the slit structure because the structure reduces an area in which the control line 13 crosses the supply lines 5 and the distribution lines 6 in the gap section 15 and thereby reduces, to a minimum, parasitic capacitance generated between the control line 13 and the supply line 5 and between the control line 13 and the distribution lines 6. A greater parasitic capacitance results in an additional load on the source driver 2 and hence an increased power consumption. Hence, a smaller parasitic capacitance contributes to a reduction in power consumption by the source driver 2.

The slit structure also contributes to prevention of (i) broken control lines due to peel-off or (ii) abnormalities of TFT-M properties for the following reasons. In the absence of the slit structure, the control lines would be formed out of a metal layer which had a relatively large area because of the absence of the slit. The metal layer without a slit, which had a relatively large area, would experience film stress and warp in a TFT substrate forming process due to heating and other causes. The control lines could detach from the TFT substrate in a worst case. The detachment might break the control lines. A detachment under a TFT-M would result in operation failure or destruction of the TFT-M. In contrast, the provision of the slit in the control line enables the slit to absorb the film stress, making occurrence of peel-off less likely.

(Details of Arrangement of Switching Elements in Signal Distribution Circuit)

Referring to FIG. 3, the drain electrode 11, to describe it in more detail, is provided with a first branch section which branches out like a comb. The source electrode 12 is similarly provided with a second branch section which branch out like a comb.

Figure 22:
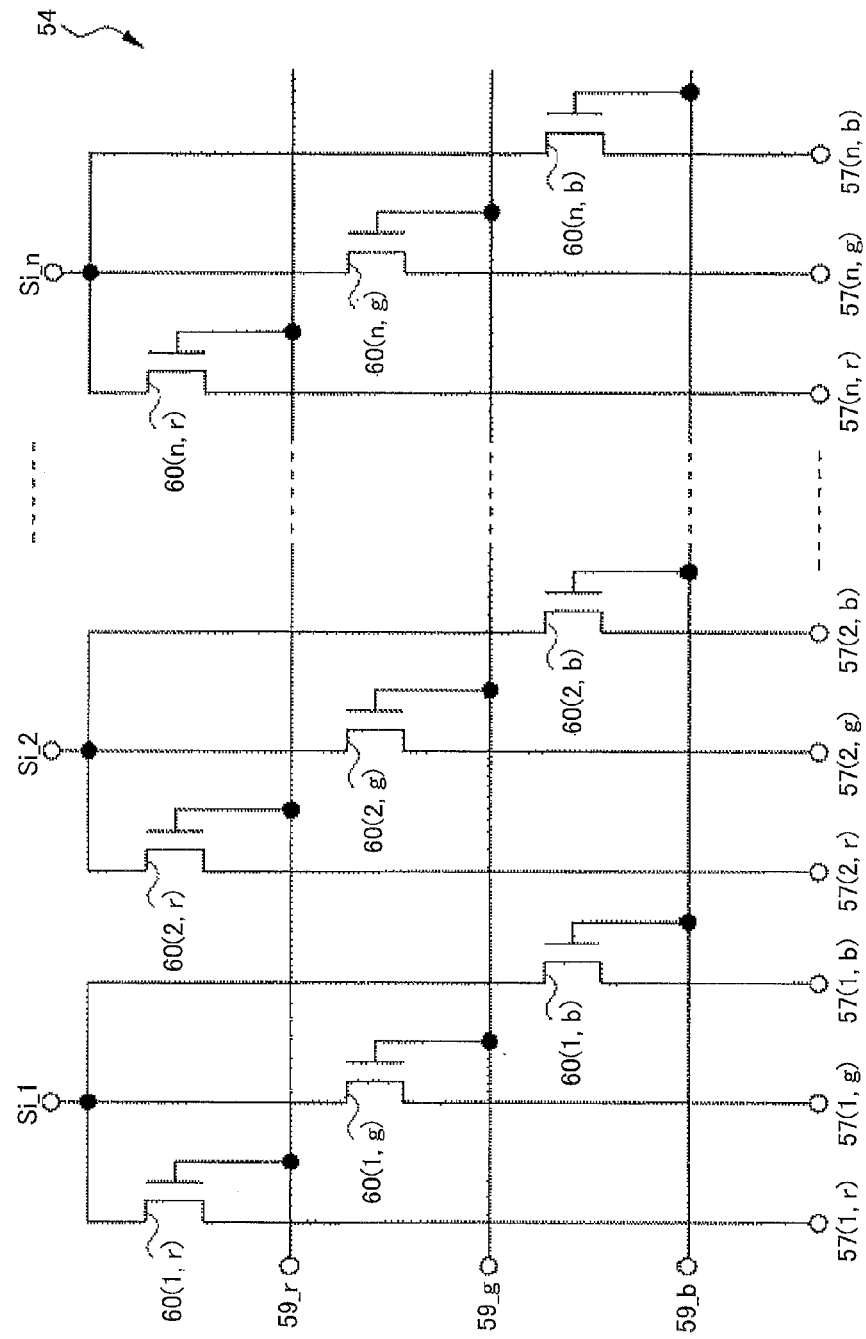
FIG. 22

The first and second branch sections interleave with each other and overlap the gate electrode 10 which is connected to the control line 13 as illustrated in FIG. 22 or to overlap the control line 13 which functions as the gate electrode 10 as illustrated in FIG. 3. To reduce an area to which the signal distribution device 3 is mounted, the TFT-M is preferably located on the control line 13 as illustrated in FIG. 3.

The TFT-M has a channel layer which is composed of an amorphous silicon (a-Si), a microcrystal silicon (μc-Si), a laminate of an amorphous silicon and a microcrystal silicon, or a semiconductor oxide.

The alternate provision of the first and second branch sections allows for a practically greater channel width for the TFT-M. This is suited for a display device which requires high switching speed, for example, high-definition, large screen display devices which are driven at high frame rate. Furthermore, if the semiconductor layer (channel layer) for switching elements is composed of a material with a relatively low mobility, such as amorphous silicon, the channel width of the switching elements can be increased without increasing channel area.

If the switching elements are composed of a microcrystal silicon, a laminate of an amorphous silicon and a microcrystal silicon, or a semiconductor oxide, which have a greater mobility than amorphous silicon, the switching elements are suited for a display device which requires higher switching speed.

(Details of Arrangement of Supply Lines)

Figure 2:
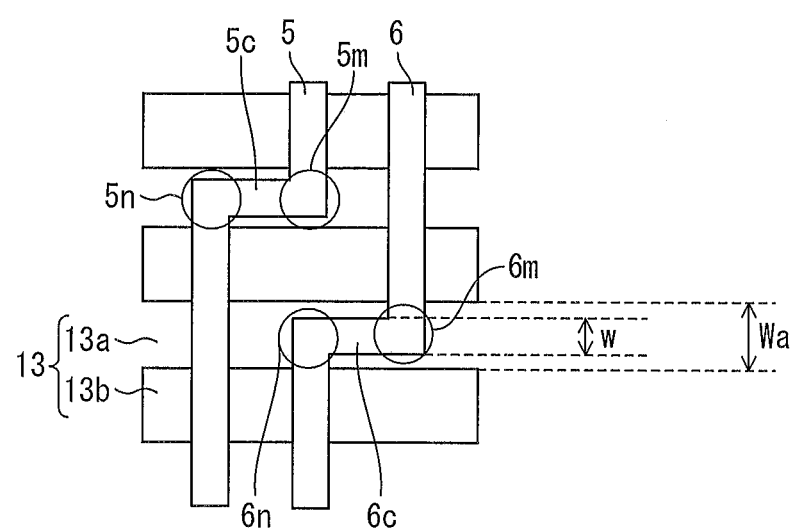
FIG. 2
Figure 6:
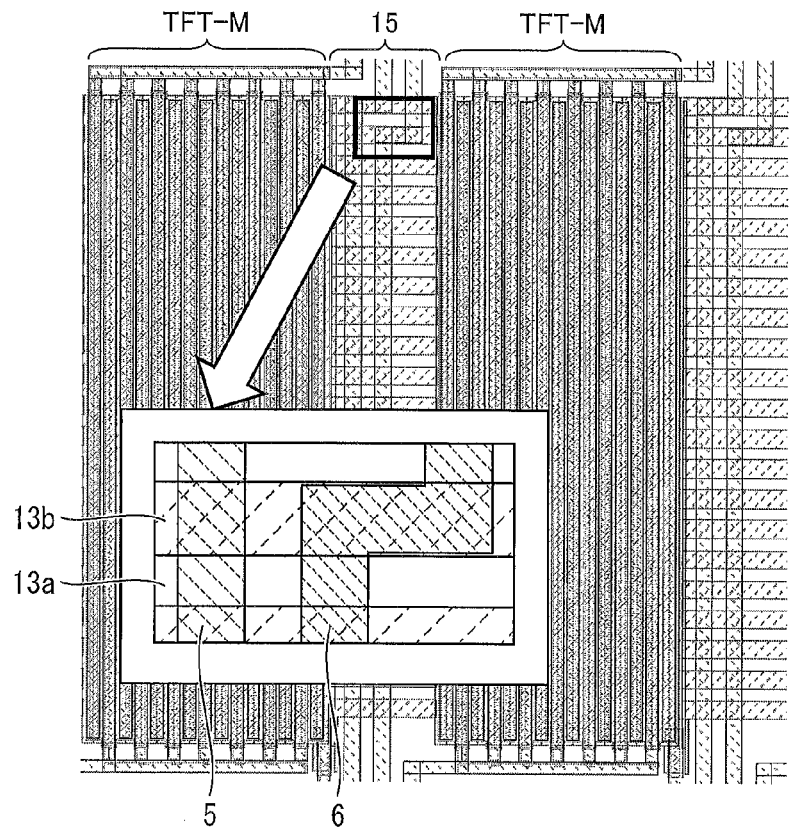
FIG. 6

FIG. 1 is a plan view illustrating in details an arrangement of the supply lines 5 and the distribution lines 6 and also illustrating relative positions of (i) the supply lines 5 and the distribution lines 6 and (ii) slits 13a and grating sections 13b of the control lines 13. FIG. 2 is a plan view of major components, showing another example of relative positions of (i) the supply line 5 and the distribution line 6 and (ii) the slits 13a and the grating section 13b of the control line 13. FIG. 6 is an illustration of TFT-M's in which drain electrodes 11, source electrodes 12, and slits 13a and grating sections 13b of control lines 13 are fabricated at higher density.

Referring to FIGS. 1 to 3 and 6, the supply line 5 originates at the input terminal Qin and reaches the drain electrodes 11, of TFT-Mr, TFT-Mg, and TFT-Mb, which further lead to the respective output terminals Qr, Qg, and Qb.

The supply line 5 branches out midway between the input terminal Qin and the drain electrodes 11 toward the TFT-Mr, TFT-Mg, and TFT-Mb and bends either in a direction which intersects with the extending direction of the control line 13 (e.g., perpendicular to the extending direction) or in a direction which extends in the extending direction of the control line 13 (e.g., parallel to the extending direction), in a suitable manner in accordance with wiring layout requirements.

The supply lines 5 in FIGS. 1 and 3 are formed in different manners as follows. In FIG. 1, the supply line 5 is composed of a source metal, which forms the same layer as the drain electrodes 11 and the source electrodes 12, all the way from its origin at the input terminal Qin, branching out midway into three branches, to its ends at the drain electrodes 11. In contrast, in FIG. 3, the supply line 5 is composed of a gate metal (indicated by shadow), which forms the same layer as the gate electrodes 10 and the control lines 13, from its origin at the input terminal Qin to the midway branching point at which the supply line 5 extends via a gate metal/source metal contact and branches out into three branches in a source metal.

Whether to form the supply line 5 should be composed from a gate metal or a source metal from the input terminal Qin to the branching point may be determined suitably according to wiring layout requirements.

If the supply line 5 first extends in a direction intersecting with the extending direction of the control line 13 and then bends in a direction which extends in the extending direction of the control line 13, the supply line 5 has an extension section 5a (FIG. 1) or 5b (FIG. 1) which extends in the extending direction of the control line 13.

The extension section 5a is provided outside the control line 13. The extension section 5b is provided inside an area in which the control line 13 is provided.

The extension section 5a forms a stem section of the first branch section of the drain electrode 11. The extension section 5a is located within a space which is adjacent to the control line 13, that is, a space in which there is provided no control line 13.

In contrast, the extension section 5b is located in a gap section 15 between TFT-M's arranged in the extending direction of the control line 13.

Furthermore, the (e.g., three) control lines 13 constituting a signal distribution circuit 4 are provided adjacent to each other and parallel to the extending direction, so that each of the (e.g., three) TFT-M's is located on a different one of the control lines 13.

Therefore, as illustrated in FIGS. 1 to 3, the supply line 5 is bent in the gap section 15 in a suitable manner in accordance with wiring layout requirements to pass over one of adjacent control lines 13 and connect to the TFT-M on the other control line 13. As a result, the extension section 5b is provided in each gap section 15 of the control lines 13 which are adjacent to each other.

The extension section 5a is provided with a control line outward bend section 5p as a bend section which is bent in a direction intersecting with the extending direction and approaching the input terminal Qin.

The extension section 5b is provided with: a first bend section 5m which is bent in a direction intersecting with the extending direction and approaching the input terminal Qin; and a second bend section 5n which is bent in a direction intersecting with the extending direction and approaching the output terminal Qout.

It should be noted here that the extension sections 5a and 5b are each formed at positions which do not overlap edge portions of the control line 13 in the extending direction of the control line 13.

Firstly, the extension section 5a is located in a space in which there is provided no control line 13 as mentioned above, so as not to overlap the edge portions of the control line 13 in the extending direction of the control line 13.

Secondly, the extension section 5b is located on the grating section 13b and confined within a width Wb of the grating section 13b, so as not to overlap edge portions of the grating section 13b in an extending direction of the grating section 13b in the gap section 15. In other words, a width w of the extension section 5b and the width Wb of the grating section 13b have a relationship w≤Wb.

An alternative example is shown in FIG. 2 in which an extension section 5c is located in the slit 13a, so as not to overlap the edge portions of the grating section 13b in the extending direction of the grating section 13b in the gap section 15. The extension section 5c is confined within a width Wa of the slit 13a. In other words, the width w of the extension section 5b and the width Wa of the slit 13a have a relationship w≤Wa.

(Details of Arrangement of Distribution Lines)

Next, an arrangement of the distribution lines 6 will be described in detail. Referring to FIGS. 1 to 3 and 6, the distribution line 6 originates at a source electrode 12 and reaches a corresponding output terminal Qout.

The distribution line 6 bends midway between the source electrode 12 and the output terminal Qout either in a direction which intersects with the extending direction of the control line 13 or in a direction which extends in the extending direction of the control line 13, in a suitable manner in accordance with wiring layout requirements.

If the distribution line 5 bends from a direction which extends in the extending direction of the control line 13 to a direction which intersects with the extending direction of the control line 13, the distribution line 6 has an extension section 6a (FIG. 1) or 6b (FIG. 1) which extends in the extending direction of the control line 13.

The extension section 6a forms a stem section of the second branch section of the source electrode 12. The extension section 6a is located within a space which is adjacent to the control line 13, that is, a space in which there is provided no control line 13, or within a space between the control lines 13 arranged adjacent to each other in the extending direction.

Since the distribution line 6 is bent in the gap section 15 in a suitable manner in accordance with wiring layout requirements as illustrated in FIGS. 1 to 3, the extension section 6b is located in the gap section 15.

The extension section 6a is provided with a control line outward bend section 6p (FIG. 1) as a bend section which is bent in a direction intersecting with the extending direction and approaching the output terminal Qout.

The extension sections 6a and 6b are each provided with: a first bend section 6m which is bent in a direction intersecting with the extending direction and approaching the input terminal Qin; and a second bend section 6n which is bent in a direction intersecting with the extending direction and approaching the output terminal Qout.

It should be noted here that the extension sections 6a and 6b are also each formed at positions which do not overlap the edge portions of the control line 13 in the extending direction of the control line 13.

Firstly, the extension section 6a is located in a space in which there is provided no control line 13 as mentioned above, so as not to overlap the edge portions of the control line 13 in the extending direction of the control line 13.

Secondly, the extension section 6b is located on the grating section 13b and confined within the width Wb of the grating section 13b, so as not to overlap the edge portions of the grating section 13b in the extending direction of the grating section 13b in the gap section 15. In other words, a width w of the extension section 6b and the width Wb of the grating section 13b have a relationship w≤Wb.

An alternative example is shown in FIG. 2 in which an extension section 6c is located in the slit 13a and confined within the width Wa of the slit 13a, so as not to overlap the edge portions of the grating section 13b in the extending direction of the grating section 13b in the gap section 15. In other words, a width w of the extension section 6c and the width Wa of the slit 13a have a relationship w≤Wa.

(Effects of Improvement of Display Quality)

Figure 9:
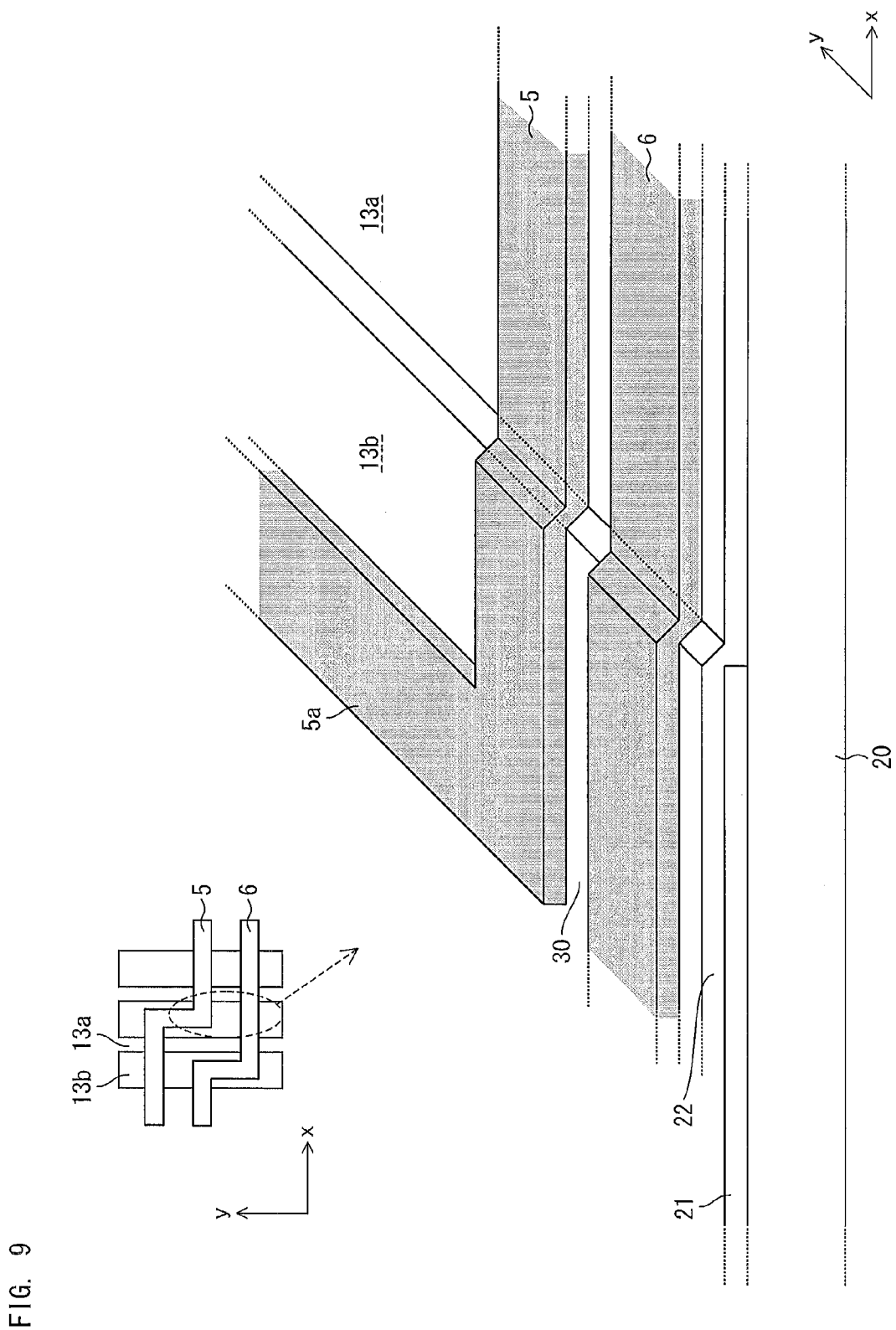
FIG. 9
Figure 10:
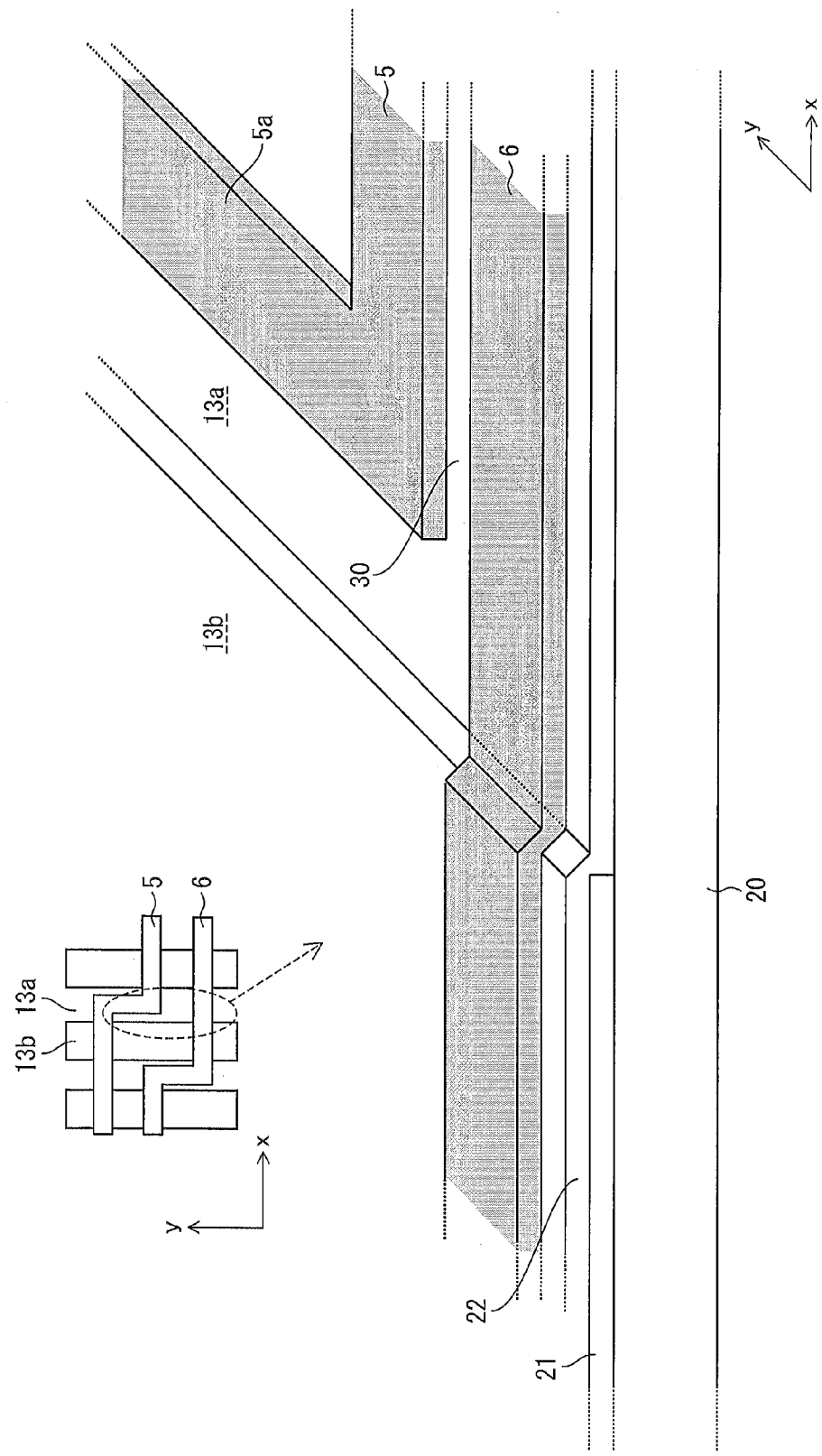
FIG. 10

FIGS. 9 and 10 are combination drawings of a partial plan view illustrating the condition of wiring of Embodiment 1 in the gap section 15 of the control line 13 and an enlarged perspective view illustrating wiring in an area indicated in the partial plan view.

The signal distribution device 3 is fabricated by forming a gate metal layer 21 on a glass substrate 20 and patterning the gate metal layer 21 to form the gate electrodes 10 electrically connected to the control lines 13 or the control lines 13 functioning as the gate electrodes 10. In the process, the slits 13a and the grating sections 13b of the control lines 13 are simultaneously formed.

Next, the patterned gate metal layer 21 is covered with a gate insulating film 22. This results, as illustrated in FIGS. 9 and 10, in steps being formed in the gate insulating film 22 due to the presence of steps along the edge portions of the grating sections 13b at boundaries between the slits 13a and the grating sections 13b. A metal layer is laminated on the gate insulating film 22 and patterned to form wiring which corresponds to the supply lines 5 and the distribution lines 6.

The extension section 5a (6a) extends in the extending direction of the grating section 13b so as not to overlap the edge portions of the grating section 13b. In other words, the extension section 5a (6a) is not provided on the steps formed along the edge portions of the grating section 13b.

If a greater portion of the metal layer from which the supply lines 5 and the distribution lines 6 will be formed is to be left on the steps, more etching residues will be produced from the metal layer. However, the wiring layout shown in FIG. 9 allows for little overlapping between the steps and the supply line 5 and the distribution line 6. The wiring layout thus hardly affects progress of the etching. This prevents generation of etching residues in a region 30 between wires adjacent to each other and makes it easier to form the wiring with a constant thickness.

As a result, the supply lines 5 and the distribution lines 6 are prevented from being short-circuited to each other, and unevenness of parasitic capacitances and line resistances related to the supply lines 5 and the distribution lines 6 can be restrained. An effect that the display quality of a display device can be improved can be thus achieved.

The wiring layout shown in FIG. 10 further reduces overlapping of the steps and wiring and sufficiently separate the extension section 5a (6a) from the steps. The effect is further enhanced.

(Comparative Example)

Figure 7:
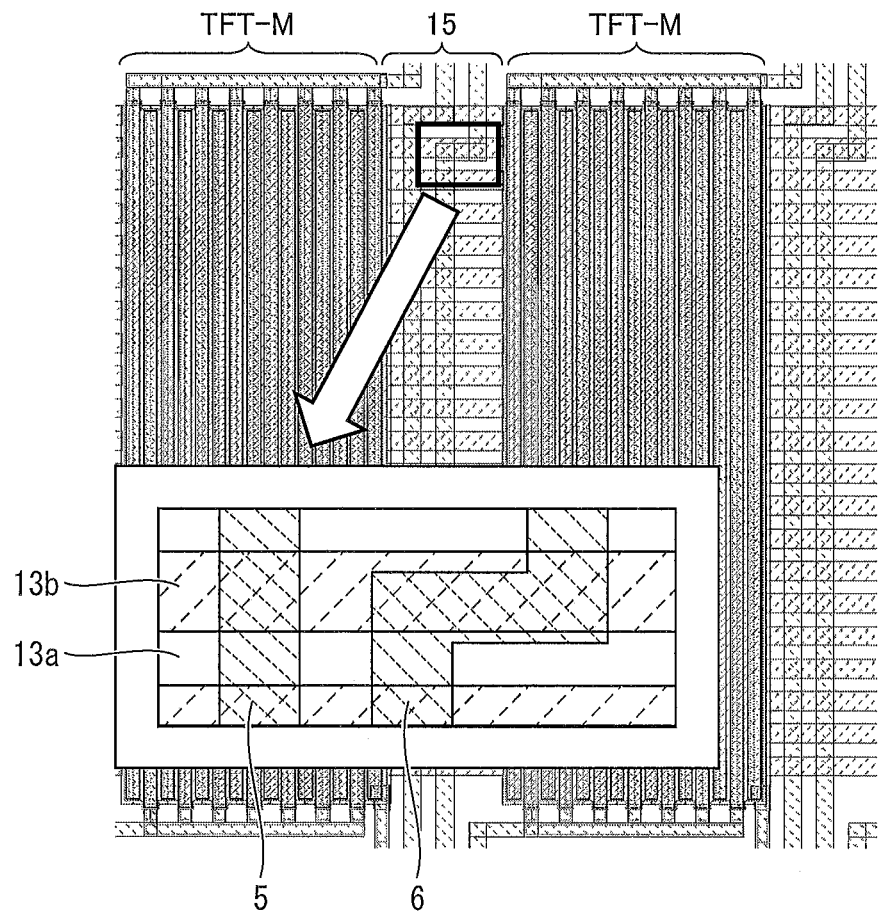
FIG. 7
Figure 8:
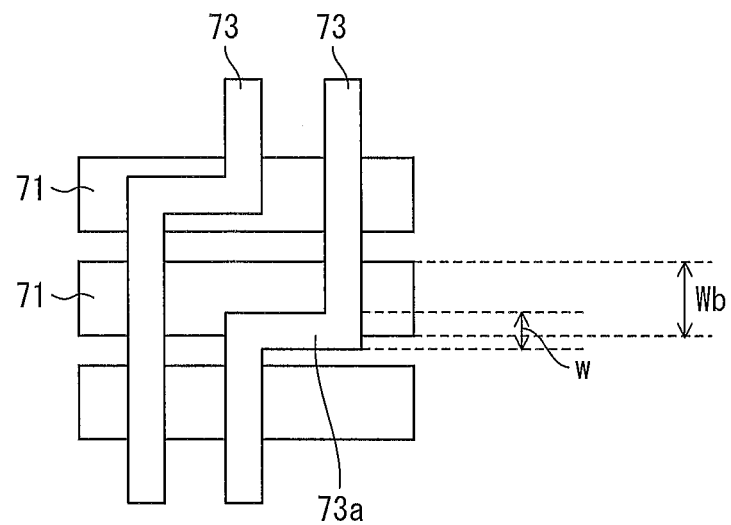
FIG. 8
Figure 11:
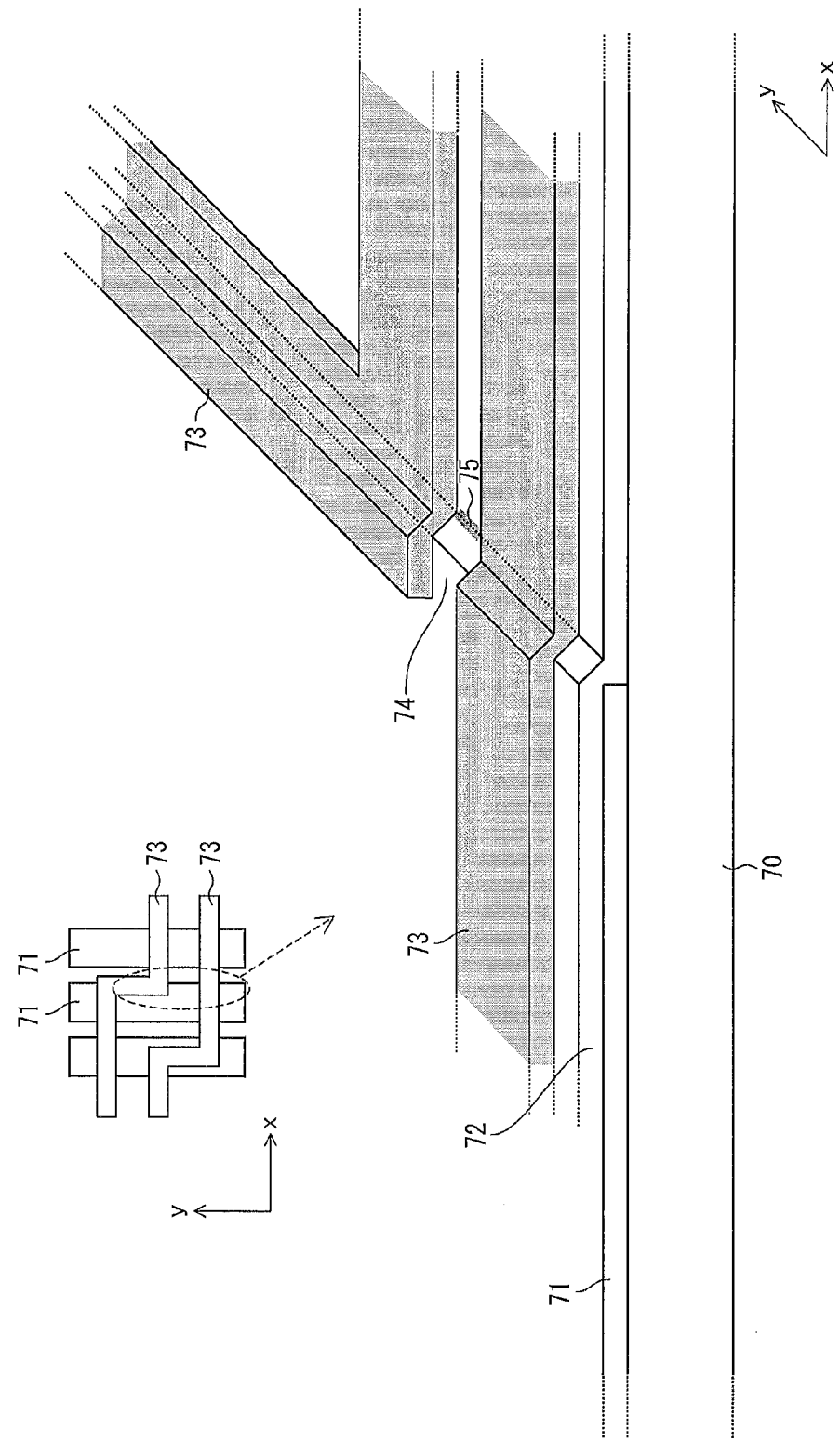
FIG. 11

FIGS. 7, 8, and 11 illustrate comparative examples of wiring. FIG. 7 is an illustration of TFT-M's, a gap section 15, and wiring in the gap section 15. FIG. 8 is an enlarged illustration of the condition of wiring in the gap section 15. FIG. 11 is a combination drawing of a partial plan view illustrating the condition of wiring in the gap section 15 and an enlarged perspective view illustrating wiring in an area indicated in the partial plan view.

Referring to FIGS. 7, 8, and 11, wires 73 have extension sections being formed with an extended length along steps formed on edge portions of control wires 71, so as to overlap the edge portions of the control wires 71. The wires 73 correspond to the supply line 5 or the distribution lines 6. The extension sections correspond to the extension section 5a (6a). The control wires 71 correspond to the control lines 13 or the grating sections 13b. As a result, as illustrated in FIG. 8, a width w of an extension section 73a is not confined within a width Wb of a control wire 71.

As described earlier in relation to problems to be solved by the present invention in reference to FIG. 11, a metal layer from which the wires 73 will be formed will be difficult to etch, and residues of the metal layer will be likely to remain near the steps, if longer wires 73 are to be formed along the steps. Due to these effects, etching residues 75 will likely remain on the steps in regions 74 between adjacent wires 73. The etching residues 75 may short-circuit the adjacent wires 73, and even if not, might change parasitic capacitances or line resistances of the wires 73.

In an arrangement in which a wire 73 partly overlaps edge portions of a control wire 71 in an extending direction of the control wire 71, the steps make it difficult to form the wire 73 with a constant thickness. This could be another cause for uneven parasitic capacitances and line resistances of the wire 73.

Therefore, the line arrangement of comparative signal distribution circuits may cause irregular display quality in a display device.

(Comparison of Resistance of Control Lines)

To lower the resistance of the control lines 13 and reduce waveform distortion of the selection signal, the wiring layout in which the extension section 5a (6a) is located on the grating section 13b as illustrated in FIGS. 1 and 9 ("pattern A") is preferred over the wiring layout in which the extension section 5a (6a) is located in the slit 13a as illustrated in FIGS. 2 and 10 (pattern B).

Pattern B requires the slit 13a to have a large width Wa to allow for the extension section 5a (6a) to be provided in the slit 13a. To increase the width Wa of the slit 13a, the width Wb of the grating section 13b conversely needs to be reduced due to dimensional constraints in providing the signal distribution device 3 in a peripheral area of the display panel. This requirement increases the resistance of the control line 13 and can be a cause for waveform distortion of the selection signal.

In contrast, in pattern A, since the extension section 5a (6a) is located on the grating section 13b, the width Wa of the slit 13a is not under the constraints related to the width w of the extension section 5a (6a). Therefore, pattern A allows for the slit 13a to have a smaller width Wa than pattern B. The resistance of the control line 13 can be lowered, and the waveform distortion of the selection signal can be reduced.

(Another Example of Arrangement of Control Lines)

Figure 12:
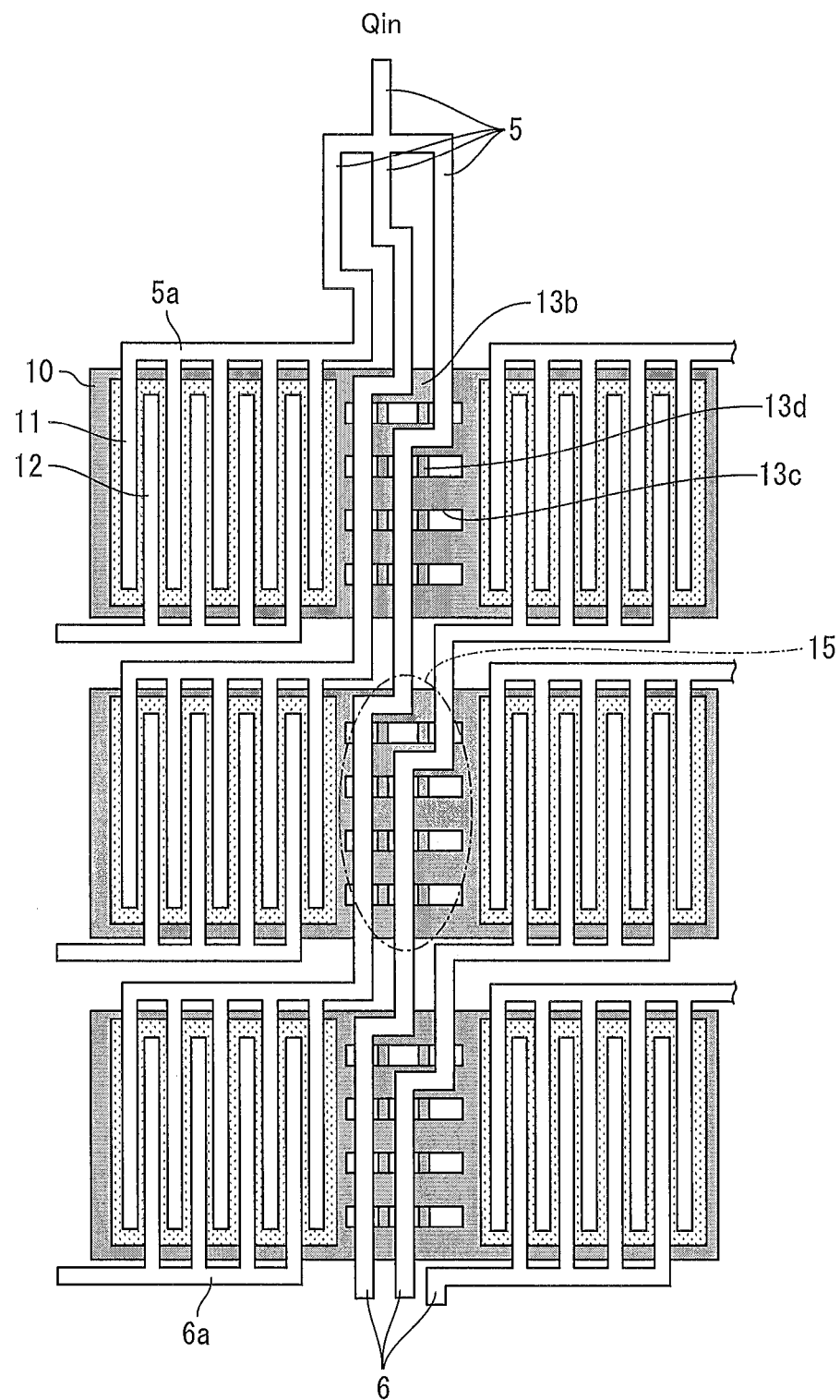
FIG. 12

FIG. 12 is a plan view illustrating slits 13c as an alternative example of the slit 13a for the control lines 13 and also illustrating the condition of wiring of supply lines 5 and distribution lines 6 for the slits 13c.

Referring to FIG. 12, the slit 13c, formed between adjacent parts of a grating section 13b, is provided therein a connecting section 13d which partially and electrically connects the adjacent parts of the grating section 13b. At least one of the supply lines 5 and the distribution lines 6 is arranged to cross the gap sections 15 so as not to overlap the connecting section 13d.

Any number of connecting sections 13d may be formed in a slit 13c so long as at least one of the supply lines 5 and the distribution lines 6 do/does not overlap the connecting section(s) 13d.

If a plurality of connecting sections 13d are formed in a slit 13c, the at least one of the supply lines 5 and the distribution lines 6 which is/are arranged to cross the gap sections 15 passes through gaps between the plurality of connecting sections 13d as illustrated in FIG. 12.

The above arrangement, in which the slit 13c is provided with a connecting section 13d, allows for the control line 13 to have a lower resistance than an arrangement in which the slit 13c is not provided with a connecting section 13d. Besides, the above arrangement does not cause a problem that parasitic capacitance generated by crossings of at least one of the supply lines 5 and the distribution lines 6 and the control lines 13 increases due to the connecting section 13d, because at least one of the supply lines 5 and the distribution lines 6 is arranged to cross the gap sections 15 so as not to overlap the connecting section 13d.

[Embodiment 2]

The following will describe another embodiment of the present invention in reference to drawings. The dimensions, materials, shapes, relative positions, etc. of components described in Embodiment 2 are only illustrative and are not intended to limit the scope of the invention unless otherwise indicated. For convenience, members of Embodiment 2 that have the same arrangement as members of Embodiment 1 are indicated by the same reference numerals/symbols and description thereof is omitted.

(Wiring Structure 1 of Signal Distribution Device)

Figure 13:
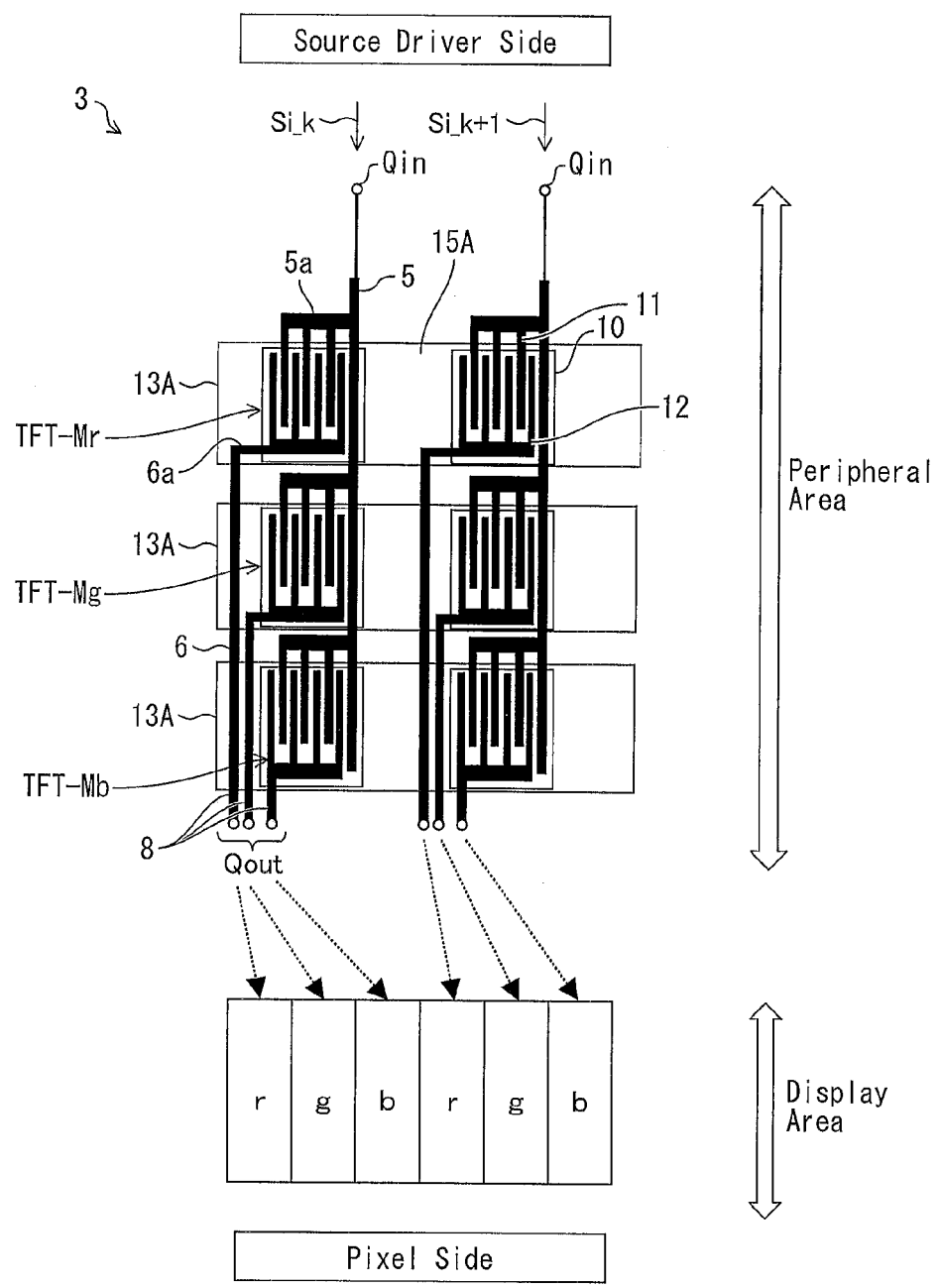
FIG. 13

FIG. 13 is an illustration of a wiring structure for a selecting circuit 4 in a signal distribution device 3 (FIG. 4) in accordance with Embodiment 2. A line arrangement from an input terminal Qin to distribution lines 6 and output terminals Qout via a supply line 5 and a TFT-Mr, a TFT-Mg, and a TFT-Mb each provided with a drain electrode 11 and a source electrode 12 is basically identical to the line arrangement described in Embodiment 1.

In FIG. 13, m rows and n columns of pixels are provided. Each pixel is composed of a set of three subpixels provided respectively with a red (r), a green (g), and a blue (b) color filter, The input terminal Qin is fed with a video signal Si_k supplied from the source driver 2 (FIG. 4) (k is an integer such that 1≤k≤n).

Each selecting circuit 4 is connected to gate electrodes 10 of associated TFT-M's or provided with a plurality of control lines 13A which function as the gate electrodes 10.

The control line 13A has a gap section 15A being formed between adjacent TFT-M's arranged in an extending direction of the control line 13A. The control line 13A differs from the control line 13 in that the gap section 15A has no slit 13a or grating section 13b formed therein.

Embodiments 1 and 2, however, share a common arrangement which is an important feature of the present invention. Specifically, extension sections 5a which extend from the supply line 5 in an extending direction of the control line 13A and extension sections 6a which extend from the distribution lines 6 in an extending direction of the control line 13A are located either in a space in which there is provided no control line 13A or within the control line 13A, so as not to overlap edge portions of the control line 13A in an extending direction of the control line 13A.

Figure 14:
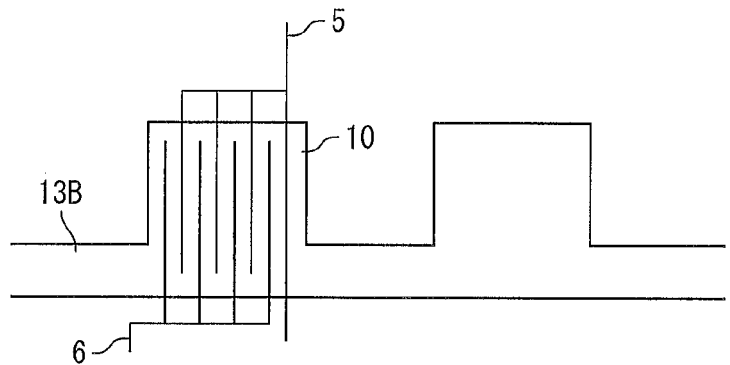
FIG. 14

An alternative example of the control line 13A is schematically shown in FIG. 14 which illustrates a control line 13B. A gate electrode 10 is formed in a direction intersecting with an extending direction of the control line 13B so as to jut out of the control line 13B. The control line 13B is formed so that the control line 13B has a width which is smaller than that of the control line 13A in those parts which exist between gate electrodes 10 which are adjacent to each other on the control line 13B.

(Wiring Structure 2 for Signal Distribution Device)

Figure 15:
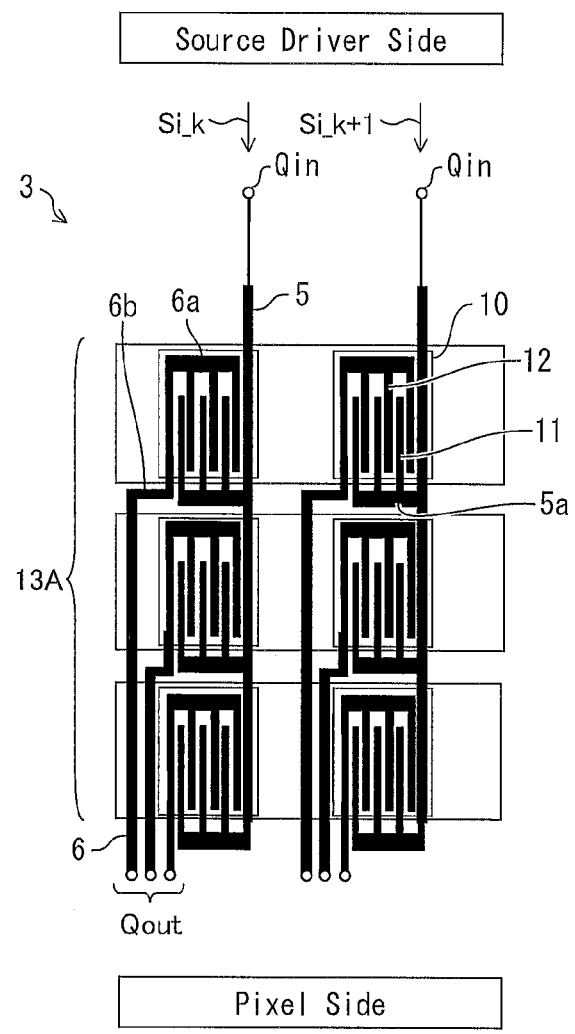
FIG. 15

FIG. 15 is an illustration of another wiring structure for the signal distribution device 3 as viewed from above. The extension section 5a, which forms a stem section of a branch of the drain electrode 11 in a TFT-M, is not necessarily located on a source driver side when viewed from the control line 13A as shown in FIG. 13. Alternatively, as illustrated in FIG. 15, the drain electrode 11 may be located across from its location in FIG. 13, that is, the extension section 5a may be located on a pixel side when viewed from the control line 13A.

In wiring structure 2, the extension section 5a and the extension section 6b, which is formed by the distribution line 6 being bent, are located in a space in which there is provided no control line 13A. The extension section 6a, which forms a stem section of a branch of the source electrode 12, is located within the control line 13A.

(Wiring Structure 3 for Signal Distribution Device)

Figure 16:
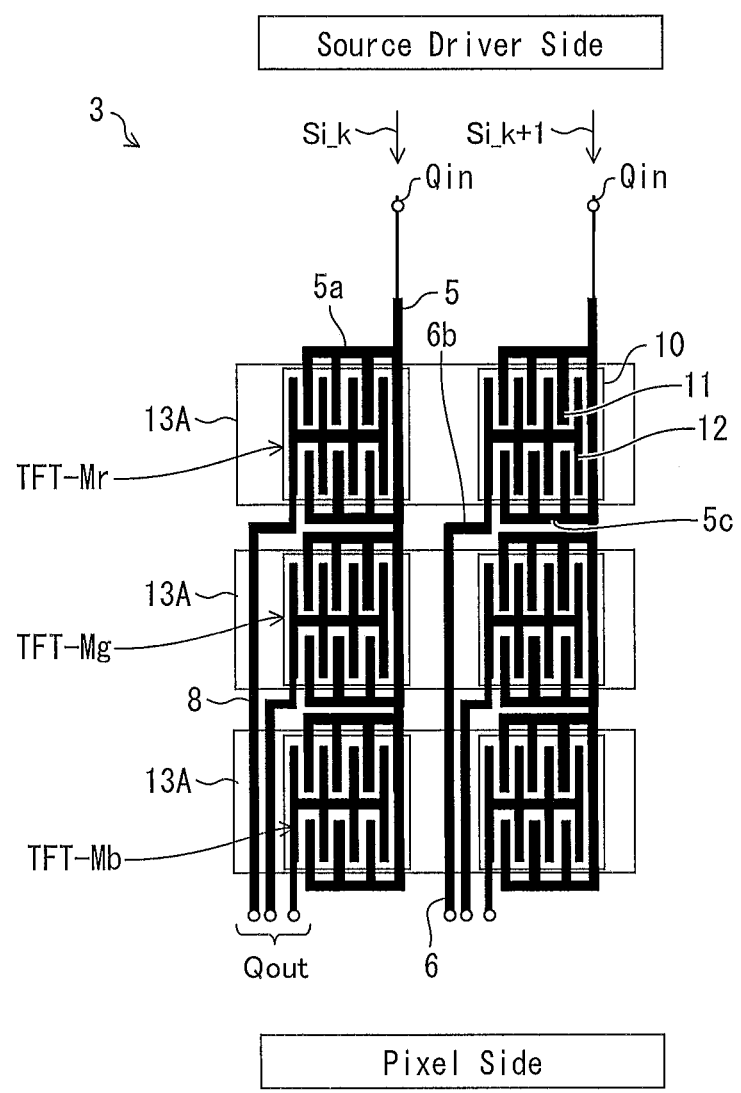
FIG. 16

FIG. 16 is an illustration of another wiring structure for the signal distribution device 3 as viewed from above. Changes are made to the arrangement of electrodes of each TFT-M as shown in FIG. 16. The changes result in the supply line 5 and the distribution line 6 having a wiring structure which differs from the wiring structures discussed above.

Specifically, referring to FIG. 16, each source electrode 12 is provided with: a stem section in a middle portion of the control line 13A (i.e., along a middle line which extends in an extending direction of the control line 13A); and branch sections which extend like fish bones from the stem section toward both a source driver side and a pixel side. Each drain electrode 11 is provided with: an extension section 5a and an extension section 5c which respectively form stem sections on the source driver side and the pixel side when viewed from the control line 13A; and branch sections which extend from the two extension sections 5a and 5c toward the middle portion of the control line 13A.

In wiring structure 3, the extension sections 5a and 5c and the extension section 6b, which is formed by the distribution line 6 being bent, are located in a space in which there is provided no control line 13A.

The arrangement in FIG. 16 allows for a practically greater channel width, and hence a greater switching speed, for the TFT-M.

(Wiring Structure 4 of Signal Distribution Device)

Figure 17:
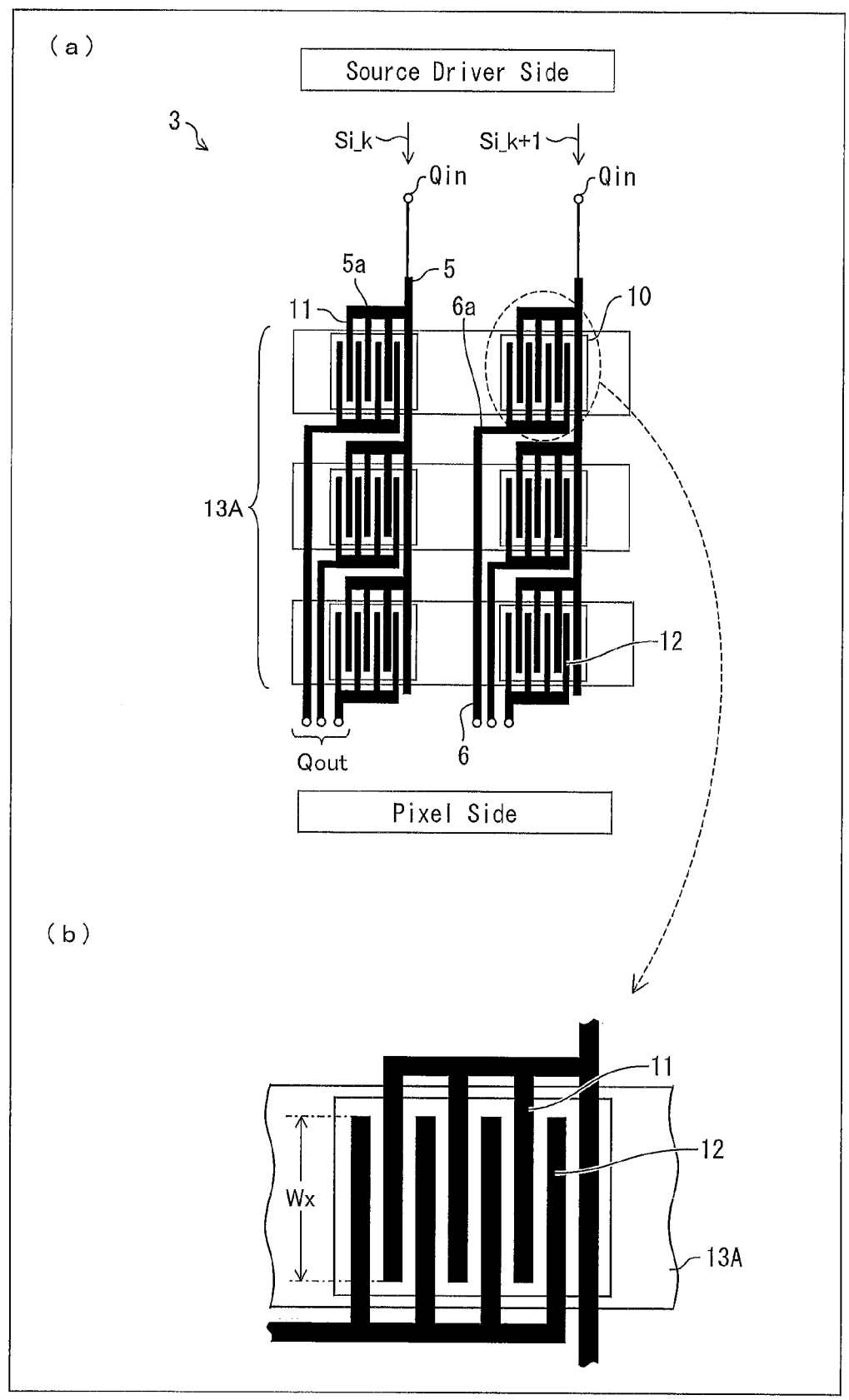
FIG. 17

(a) and (b) of FIG. 17 are illustrations of another wiring structure for the signal distribution device 3 as viewed from above. Wiring structure 4 is essentially the same as the wiring structure in FIG. 1, except that the control lines 13 are replaced by control lines 13A.

As shown in (a) of FIG. 17, the extension section 5a which forms a stem section of the drain electrode 11 and the extension section 6a which forms a stem section of the source electrode 12 are located in a space in which there is provided no control line 13A.

The channel width (=W), which affects the switching speed of the TFT-M, is determined by multiplying the basic channel width $W_X$ by the number, m, of sites in which a drain electrode 11 faces a source electrode 12. The basic channel width $W_X$ is, as shown in (b) of FIG. 17, is the width of a region in which adjacent drain and source electrodes 11 and 12 face each other. In the example shown in (b) of FIG. 17, since m=7, Channel Width (=W)=$W_X$×7.

(Wiring Structure 5 of Signal Distribution Device)

Figure 18:
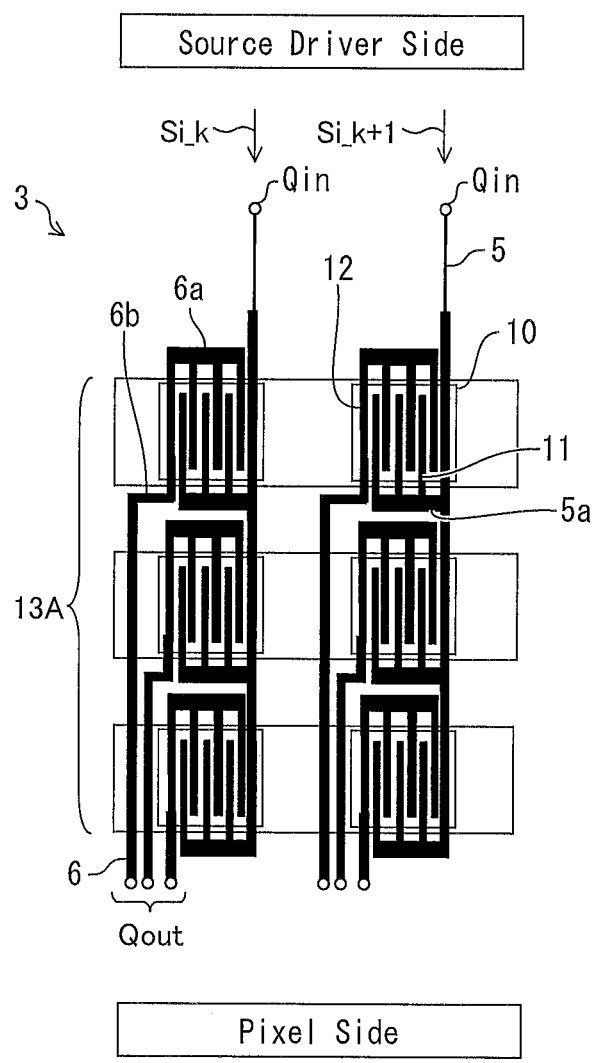
FIG. 18

FIG. 18 is an illustration of another wiring structure for the signal distribution device 3 as viewed from above. As illustrated in FIG. 18, wiring structure 5 differs from the wiring structure in FIG. 17 in that the drain and source electrodes 11 and 12 are transposed when compared with those shown in FIG. 17, in other words, the extension section 5a of the drain electrode 11 is located on a pixel side when viewed from the control line 13A, and the extension section 6a of the source electrode 12 is located on a source driver side.

In wiring structure 5, the extension sections 5a and 6a and the extension section 6b, which is formed by the distribution line 6 being bent, are located in a space in which there is provided no control line 13A.

The following will give a supplementary description of features of the signal distribution device in accordance with the present invention.

In a signal distribution device in accordance with the present invention:

(6) the plurality of switching elements are provided on one of the plurality of control lines in an extending direction of the one of the plurality of control lines;

(7) the adjacent switching elements arranged in the extending direction have a gap section therebetween;

(8) the one of the plurality of control lines has, at least in the gap section, a slit or slits which extend in the extending direction and a grating section which extends in the extending direction and is grated by the slit or slits; and (9) the extension sections are each formed at positions which do not overlap edge portions of the grating section in an extending direction of the grating section.

In this arrangement, the signal distribution circuit is provided with control lines connected to the gate electrodes of the switching elements as mentioned above. Therefore, each set of switching elements are provided for different one of the control lines.

In addition to the arrangement, the plurality of switching elements are provided on one of the plurality of control lines in an extending direction of the one of the plurality of control lines as in (6).

The adjacent switching elements arranged in the extending direction have a gap section therebetween. The supply lines and the distribution lines cross the gap section. The extension sections of the supply lines and the distribution lines may be formed in the gap section depending on line layout requirements.

In contrast, the gap section has a slit structure. In other words, a slit and a part of the grating section are alternately provided in the gap section. The slit structure is provided to reduce an area in which the control line crosses the supply lines and the distribution lines in the gap section and thereby reduce, to a minimum, parasitic capacitances generated between the control line and the supply line and between the control line and the distribution lines. A greater parasitic capacitance results in an additional load on the source driver and hence an increased power consumption. Hence, a smaller parasitic capacitance contributes to a reduction in power consumption by the source driver.

The slit structure also reduces contact area between the control lines and the substrate, which in turn makes the control lines and the substrate less susceptible to thermal stress in the fabrication process of the control lines and the switching elements. As a result, the slit structure also contributes to prevention of (i) broken control lines due to peel-off or (ii) abnormalities of TFT properties.

When the extension sections are provided in the gap section which has the slit structure as described above, the extension sections are formed at positions which do not overlap edge portions of the grating section in an extending direction of the grating section. The position may be determined in an area having a width parallel to a direction that is perpendicular to the extending direction of the grating section. Alternatively, the position may be determined within a space in which there is no grating section, that is, within the width of the slit.

Therefore, no extension section is provided on the steps formed along the edge portions of the grating section. This prevents generation of etching residues mentioned above and also makes it easier to form the supply lines and the distribution lines with a constant thickness. As a result, unevenness of the parasitic capacitances and line resistances related to the supply lines and the distribution lines can be restrained. An effect that the display quality of a display device can be improved can be thus achieved.

In a signal distribution circuit or a signal distribution device in accordance with the present invention, the extension sections are each located on the grating section.

This arrangement can achieve the above effect because the extension sections are located within the width of the grating section so that no extension section is provided on the steps formed along the edge portions of the grating section as already described.

In a signal distribution device in accordance with the present invention, each extension section is located in the corresponding slit.

This arrangement can achieve the above effect because the extension sections are located within the width of the slit so that no extension section is provided on the steps formed along the edge portions of the grating section as already described.

In a signal distribution circuit or a signal distribution device in accordance with the present invention, the extension sections are each provided with: a first bend section which is bent in a direction intersecting with the extending direction and approaching the input terminal; and a second bend section which is bent in a direction intersecting with the extending direction and approaching a corresponding one of the plurality of output terminals.

This arrangement allows the supply lines or the distribution lines to follow a path, from the input terminal to the output terminals, which may be bent in a gap section. The arrangement thus improves line layout freedom.

In a signal distribution device in accordance with the present invention, each slit, which is formed between adjacent parts of the grating section, is provided with a connecting section which partially and electrically connects the adjacent parts of the grating section; and at least one of the corresponding one of the supply lines and the at least one of the plurality of distribution lines is arranged to cross the gap section, so as not to overlap the connecting section.

This arrangement, in which the slit is provided with a connecting section, allows for the control line to have a lower resistance than an arrangement in which the slit is not provided with a connecting section. Besides, the arrangement does not cause a problem that parasitic capacitance generated by crossings of at least one of the supply lines and the distribution lines and the control lines increases due to the connecting section because at least one of the supply lines and the distribution lines is arranged to cross the gap sections so as not to overlap the connecting section.

One connecting section is not necessarily provided in each slit. A plurality of separate connecting sections may be provided in a single slit.

In a signal distribution circuit or a signal distribution device in accordance with the present invention,

(10) the plurality of control lines are provided adjacent to each other and parallel to the extending direction;

(11) each of the plurality of switching elements is located on a different one of the plurality of control lines; and

(12) the extension sections are each located in a space between those of the plurality of control lines which are adjacent to each other and parallel to the extending direction.

When the signal distribution device includes the arrangements (10) and (11), the supply lines or the distribution lines, from the input terminal to the output terminals, inevitably cross(es) one of the control lines. In addition, the extension sections of the supply lines and distribution lines may be formed in the space because of line layout requirements so that they follow an altered path.

When this is actually the case, the above effect can be achieved because the extension sections are located within the space so that they are not provided on the steps formed along the edge portions of the control line.

In a signal distribution circuit or a signal distribution device in accordance with the present invention, the extension section of the corresponding one of the supply lines is provided with a control line outward bend section as the bend section which is bent in a direction intersecting with the extending direction and approaching the input terminal.

This arrangement allows the supply line to follow a path, from the input terminal to the first electrodes of the switching elements, which may be bent in a space between adjacent control lines so that the supply line can follow an altered path. The arrangement thus improves line layout freedom.

In a signal distribution circuit or a signal distribution device in accordance with the present invention, the extension section of the at least one of the plurality of distribution lines is provided with a control line outward bend section as the bend section which is bent in a direction intersecting with the extending direction and approaching a corresponding one of the plurality of output terminals.

This arrangement allows the at least one of the plurality of distribution lines to follow a path, from the second electrodes of the switching elements to the output terminals, which may be bent in a space between adjacent control lines so that the at least one of the plurality of distribution lines can follow an altered path. The arrangement thus improves line layout freedom.

In a signal distribution circuit or a signal distribution device in accordance with the present invention,

(13) the first electrode has a first branch section which branches out like a comb;

(14) the second electrode has a second branch section which branches out like a comb; and

(15) the first and second branch sections interleave with each other and overlap either the gate electrode connected to a corresponding one of the plurality of control lines or one of the plurality of control lines which functions as the gate electrode.

In a signal distribution device in accordance with the present invention, the plurality of signal distribution circuits are formed monolithically on a substrate which constitutes a display panel for a display device which incorporates the signal distribution device.

Use of the signal distribution circuits in the display device enables source drivers to be reduced in number. In addition to that, the signal distribution circuits are formed monolithically on a substrate which constitutes a display panel. The number of input terminals of the display panel which are connected to the source drivers can be greatly reduced. This allows for cost reduction through the reduction of the number of source drivers and allows for cost reduction and yield improvement through simplification of manufacture steps.

In a signal distribution circuit or a signal distribution device in accordance with the present invention, each of the plurality of switching elements has a channel layer which is composed of an amorphous silicon, a microcrystal silicon, a laminate of an amorphous silicon and a microcrystal silicon, or a semiconductor oxide.

The arrangements (13) to (15) allow for a practically greater channel width for the switching elements. This is suited for a display device which requires high switching speed. Furthermore, if the semiconductor layer (channel layer) for switching elements is composed of a material with a relatively low mobility, such as amorphous silicon, the channel width of the switching elements can be increased without increasing channel area.

If the switching elements are composed of a microcrystal silicon, a laminate of an amorphous silicon and a microcrystal silicon, or a semiconductor oxide, which have a greater mobility than amorphous silicon, the switching elements are suited for a display device which requires higher switching speed.

The present invention is not limited to the description of the embodiments above, but may be altered by a skilled person within the scope of the claims. An embodiment based on a proper combination of technical means disclosed in different embodiments is encompassed in the technical scope of the present invention.

Industrial Applicability

The present invention is applicable to signal distribution devices in which an output signal from a circuit in a preceding stage is fed to a circuit in a succeeding stage via a plurality of distribution lines by time division and also to electronic apparatus, such as display devices, which incorporates such a signal distribution device.

Reference Signs List
1 Display Device
2 Signal Distribution Device
3 Selecting Circuit (Signal Distribution Circuit)
4 Supply Line
5a, 5b, 5c Extension Section
5m First Bend Section
5n Second Bend Section
5p Control Line Outward Bend Section
6 Distribution Line
6a, 6b Extension Section
6m First Bend Section
6n Second Bend Section
6p Control Line Outward Bend Section
10 Gate Electrode
11 Drain Electrode (First Electrode)
12 Source Electrode (Second Electrode)
13,13A, 13B Control Line
13a, 13c Slit
13b Grating Section
13d Connecting Section
15,15A Gap Section
20 Glass Substrate (Substrate)
56 Display Panel
61 Parasitic Capacitance
Mr, Mg, Mb TFT (Switching Element)
Qin Input Terminal
Qout Output Terminal
Qr, Qg, and Qb Output Terminal
SWr, SWg, and SWb Selection Signal

The invention claimed is:

1. A signal distribution device, comprising a plurality of signal distribution circuits,
each of the plurality of signal distribution circuits including:
a single input terminal for receiving an input signal;
a plurality of switching elements connected to the input terminal, each of the plurality of switching elements being composed of a thin film transistor;
supply lines for supplying, to the plurality of switching elements, the input signal fed to the input terminal; and
a plurality of distribution lines connected respectively to a plurality of output terminals via the plurality of switching elements,
the plurality of signal distribution circuits each distributing the input signal to the plurality of output terminals via the plurality of switching elements respectively,
wherein
each of the plurality of switching elements includes:
a gate electrode;
a first electrode connected to the input terminal via a corresponding one of the supply lines; and
a second electrode connected to a corresponding one of the plurality of output terminals via a corresponding one of the plurality of distribution lines,
the plurality of signal distribution circuits are each provided with a plurality of control lines respectively connected to, or functioning as, the gate electrodes of the plurality of switching elements, each of the plurality of control lines being for receiving a selection signal for switching on/off a corresponding one of the plurality of switching elements,
the corresponding one of the supply lines and at least one of the plurality of distribution lines each have an extension section which extends in an extending direction of a corresponding one of the plurality of control lines,
the extension sections are each formed at positions which do not overlap edge portions of the corresponding one of the plurality of control lines in the extending direction thereof,
the plurality of switching elements are provided on one of the plurality of control lines in an extending direction of the one of the plurality of control lines,
the adjacent switching elements arranged in the extending direction have a gap section therebetween,
the one of the plurality of control lines has, at least in the gap section, a slit or slits which extend in the extending direction and a grating section which extends in the extending direction and is grated by the slit or slits, and
the extension sections are each formed at positions which do not overlap edge portions of the grating section in an extending direction of the grating section.

2. The signal distribution device as set forth in claim 1, wherein the extension sections are each located on the grating section.

3. The signal distribution device as set forth in claim 1, wherein each extension section is located in the corresponding slit.

4. The signal distribution device as set forth in claim 1, wherein the extension sections are each provided with: a first bend section which is bent in a direction intersecting with the extending direction and approaching the input terminal; and a second bend section which is bent in a direction intersecting with the extending direction and approaching a corresponding one of the plurality of output terminals.

5. The signal distribution device as set forth in claim 1, wherein:
each slit, which is formed between adjacent parts of the grating section, is provided with a connecting section which partially and electrically connects the adjacent parts of the grating section; and
at least one of the corresponding one of the supply lines and the at least one of the plurality of distribution lines is arranged to cross the gap section, so as not to overlap the connecting section.

6. The signal distribution device as set forth in claim 1, wherein:
the first electrode has a first branch section which branches out like a comb;
the second electrode has a second branch section which branches out like a comb; and
the first and second branch sections interleave with each other and overlap either the gate electrode connected to a corresponding one of the plurality of control lines or one of the plurality of control lines which functions as the gate electrode.

7. The signal distribution device as set forth in claim 1, wherein the plurality of signal distribution circuits are formed monolithically on a substrate which constitutes a display panel for a display device which incorporates the signal distribution device.

8. The signal distribution device as set forth in claim 1, wherein each of the plurality of switching elements has a channel layer which is composed of an amorphous silicon, a microcrystal silicon, a laminate of an amorphous silicon and a microcrystal silicon, or a semiconductor oxide.

9. The signal distribution device as set forth in claim 1, wherein:
   a group of some of the plurality of switching elements are connected in parallel between the single input terminal and one of the plurality of output terminals;
   the group of switching elements is provided with a group of some of the plurality of control lines, so that each one of the control lines corresponds to a different one of the switching elements.

10. A display device, comprising the signal distribution device as set forth in claim 1.

* * * * *